US011950409B2

(12) United States Patent
Chiu

(10) Patent No.: US 11,950,409 B2
(45) Date of Patent: Apr. 2, 2024

(54) SEMICONDUCTOR DEVICE HAVING DIODE CONNECTED TO MEMORY DEVICE AND CIRCUIT INCLUDING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 197 days.

(21) Appl. No.: 17/706,789

(22) Filed: Mar. 29, 2022

(65) Prior Publication Data

US 2023/0320081 A1    Oct. 5, 2023

(51) Int. Cl.
*H10B 12/00* (2023.01)
*G11C 11/406* (2006.01)

(52) U.S. Cl.
CPC ........ *H10B 12/50* (2023.02); *G11C 11/40611* (2013.01); *H10B 12/31* (2023.02)

(58) Field of Classification Search
CPC ... H10B 12/50; H10B 12/31; G11C 11/40611; G11C 11/403; G11C 11/36
USPC .......................................................... 365/149
See application file for complete search history.

(56) References Cited

U.S. PATENT DOCUMENTS

| 5,572,461 | A | * | 11/1996 | Gonzalez | ............... | G11C 11/402 |
| | | | | | | 257/385 |
| 6,075,720 | A | * | 6/2000 | Leung | ................. | G11C 11/4085 |
| | | | | | | 257/E21.654 |
| 7,349,237 | B2 | * | 3/2008 | Lin | ...................... | H03K 19/185 |
| | | | | | | 365/226 |
| 8,000,139 | B2 | * | 8/2011 | Kalnitsky | .............. | H10B 69/00 |
| | | | | | | 365/185.06 |
| 2006/0244073 | A1 | | 11/2006 | Chaudhry | | |
| 2020/0035682 | A1 | | 1/2020 | Han et al. | | |

(Continued)

FOREIGN PATENT DOCUMENTS

| EP | 1831932 B1 | | 5/2013 |
| TW | 470959 B | * | 1/2002 |
| TW | 202023021 A | | 6/2020 |

(Continued)

OTHER PUBLICATIONS

Office Action dated Mar. 2, 2023 related to Taiwanese Application No. 111122085.

(Continued)

*Primary Examiner* — Fernando Hidalgo
(74) *Attorney, Agent, or Firm* — Xuan Zhang

(57) ABSTRACT

A semiconductor device and a circuit are provided. The semiconductor device includes a substrate, a first gate structure, a first doped region, and a capacitor structure. The substrate includes a first well region having a first conductive type. The first gate structure is disposed on the substrate. The first doped region is in the substrate and has a second conductive type different from the first conductive type. The first gate structure and the first doped region are included in a first transistor. The capacitor structure includes a first electrode electrically coupled to the first doped region. The second doped region is in the substrate and has the second conductive type. The second doped region is electrically coupled to the first electrode of the capacitor structure and the first doped region.

15 Claims, 32 Drawing Sheets

(56) References Cited

U.S. PATENT DOCUMENTS

2020/0328186 A1  10/2020  Liu
2021/0398981 A1  12/2021  Widjaja

FOREIGN PATENT DOCUMENTS

| TW | 202029416 A | 8/2020 |
| TW | 202032721 A | 9/2020 |
| TW | 202042389 A | 11/2020 |
| TW | 202145506 A | 12/2021 |

OTHER PUBLICATIONS

Office Action dated Mar. 24, 2023 related to Taiwanese Application No. 111122087.

* cited by examiner

SEMICONDUCTOR DEVICE HAVING DIODE CONNECTED TO MEMORY DEVICE AND CIRCUIT INCLUDING THE SAME

TECHNICAL FIELD

The present disclosure relates to a semiconductor device and a circuit, and more particularly, to a semiconductor device including a diode connected to a transistor and a capacitor structure and a circuit including the same.

DISCUSSION OF THE BACKGROUND

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature width or critical dimension (CD). However, recently, DRAM manufacturers face the tremendous challenge of shrinking the memory cell area as the word line spacing continues to shrink. For example, parasitic capacitance may cause the loss of charges stored in the capacitor, causing the transistor to be turned on and off repeatedly in order to refresh the data stored in the DRAM.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a first gate structure, a first doped region, and a capacitor structure. The substrate includes a first well region having a first conductive type. The first gate structure is disposed on the substrate. The first doped region is in the substrate and has a second conductive type different from the first conductive type. The first gate structure and the first doped region are included in a first transistor. The capacitor structure includes a first electrode electrically coupled to the first doped region. The second doped region is in the substrate and has the second conductive type. The second doped region is electrically coupled to the first electrode of the capacitor structure and the first doped region.

Another aspect of the present disclosure provides a circuit. The circuit includes a first transistor, a capacitor, and a diode. The first transistor includes a gate configured to receive a control signal to turn on or turn off the first transistor and a source. The capacitor includes a first terminal electrically connected to the source of the first transistor and a second terminal connected to a first voltage. The diode includes a first terminal electrically connected to the source of the first transistor and a second terminal connected to a second voltage.

Another aspect of the present disclosure provides a method for manufacturing a semiconductor device. The method includes providing a substrate. The substrate comprises a first well region having a first conductive type. The method also includes forming a first gate structure on the substrate. The method further includes forming a first doped region in the substrate. The first doped region has a second conductive type different from the first conductive type. The first gate structure and the first doped region are included in a first transistor. In addition, the method includes forming a capacitor structure electrically coupled to the first doped region of the substrate. The method also includes forming a second doped region in the substrate. The second doped region has the second conductive type, the second doped region and the first well region collectively serve a diode, and the second doped region is electrically coupled to the first electrode of the capacitor structure and the first doped region.

The embodiments of the present disclosure disclose a semiconductor device including a memory cell, a diode, and a transistor. Each of the diode and the transistor can be electrically connected to a capacitor of the memory cell. When the voltage at the node between the capacitor and the diode is lower than a threshold voltage, the diode will turn. The transistor can serve as an equalizer and will turn on after the diode has been turned on, pulling up the voltage at the node between the capacitor and the diode. As a result, the data stored in the memory cell can be refreshed automatically.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
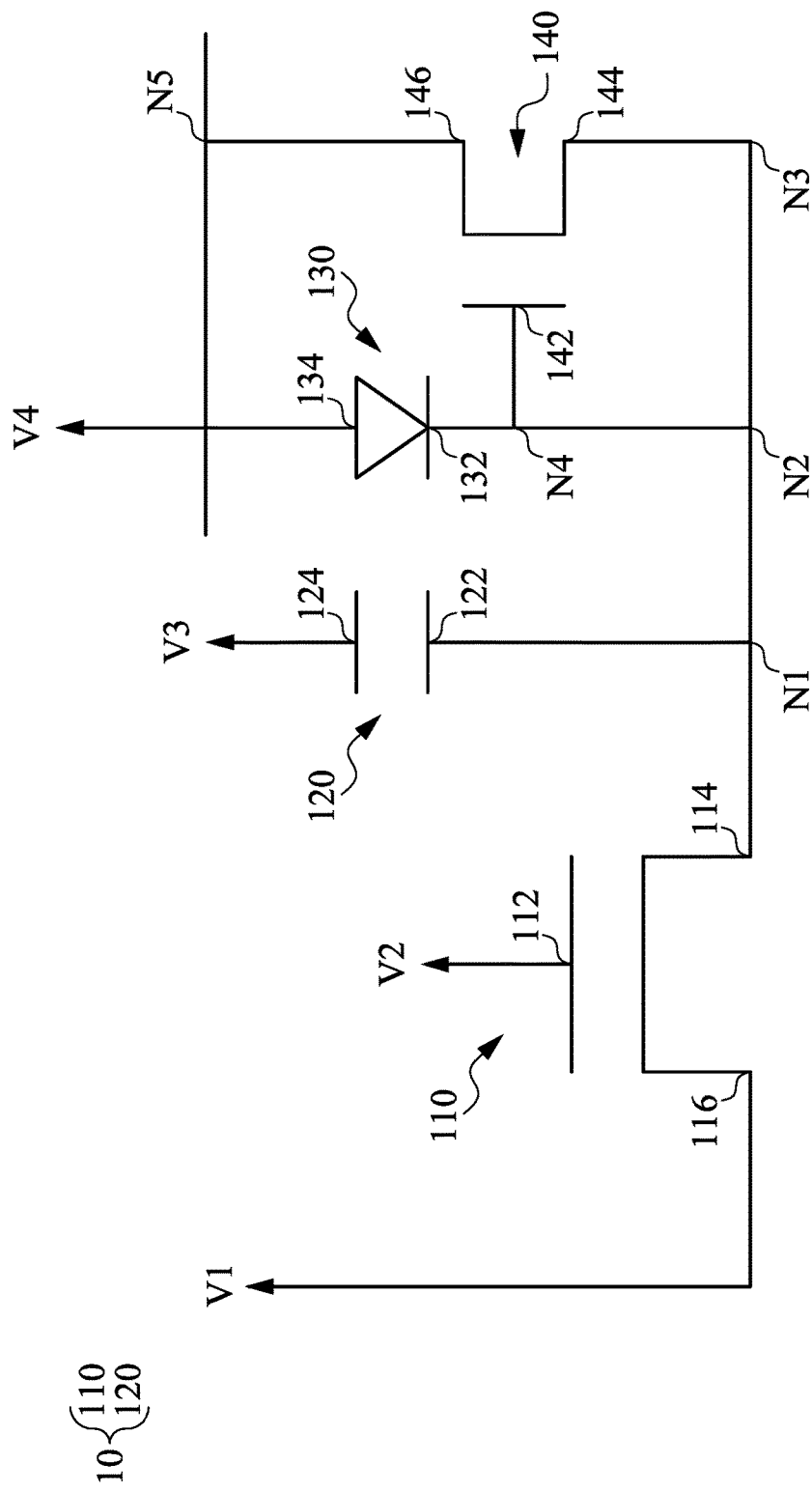
FIG. 1 is a schematic diagram of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a circuit 100, in accordance with some embodiments of the present disclosure. In some embodiments, the circuit 100 can include a transistor 110, a capacitor 120, a diode 130, and a transistor 140. In some embodiments, the circuit 100 can be included in a memory, memory device, memory die, memory chip or other components. In some embodiments, the circuit 100 can be a portion of a memory, memory device, memory die, or memory chip. For example, the circuit 100 may be a memory cell of the memory, memory device, memory die, memory chip or other components. In some embodiments, the memory can be a dynamic random access memory (DRAM). In some embodiments, the DRAM can be a double data rate four generation (DDR4) DRAM. In some embodiments, the memory includes one or more memory cells (or memory bits, memory blocks).

It should be noted that the circuit 100 can further include other components, such as active components and/or passive components electrically coupled to or connected to the transistor 110, the capacitor 120, the diode 130 and/or the transistor 140. The active components may include a memory device (e.g., dynamic random access memory (DRAM) device, a static random access memory (SRAM) device, etc.)), a power management device (e.g., power management integrated circuit (PMIC) device)), a logic device (e.g., system-on-a-chip (SoC), central processing unit (CPU), graphics processing unit (GPU), application processor (AP), microcontroller, etc.)), a radio frequency (RF) device, a sensor device, a micro-electro-mechanical-system (MEMS) device, a signal processing device (e.g., digital signal processing (DSP) device)), a front-end device (e.g., analog front-end (AFE) devices)) or other active components. The passive component may include a capacitor, a resistor, an inductor, a fuse or other passive components.

The transistor 110 can include a gate 112, a terminal 114, and a terminal 116. The gate 112 can be configured to receive a signal, such as a voltage V2, thereby determining whether the transistor 110 is turned on or turned off. In some embodiments, the gate 112 can be configured to receive a control signal (e.g., the signal connected to the voltage V2) to turn on or turn off the transistor 110.

In some embodiments, the terminal 114 can be electrically coupled to or connected to the capacitor 120. In some embodiments, the terminal 114 can be electrically coupled to or connected to the diode 130. In some embodiments, the terminal 114 can be electrically coupled to or connected to the transistor 140.

The terminal 116 be configured to receive a signal, such as a voltage V1. For example, in the case that the transistor 110 is turned on, the terminal 116 is configured to receive data to be written in the circuit 100.

In some embodiments, the transistor 110 can be an N-metal-oxide-semiconductor (NMOS). The terminal 114 can be a source of the transistor 110. The terminal 116 can be a drain of the transistor 110. In some embodiments, the transistor 110 can be a P-metal-oxide-semiconductor (PMOS). The terminal 114 can be a drain of the transistor 110. The terminal 116 can be a source of the transistor 110.

The capacitor 120 can include a terminal 122 and a terminal 124. In some embodiments, the capacitor 120 can be configured to store charge(s). In some embodiments, the capacitor 120 can be configured to store an imbalance of charge(s). In some embodiments, the capacitor 120 can be configured to store a potential difference between the terminals 122 and 124. In some embodiments, the capacitor 120 can be electrically connected between a signal, such as a voltage V3, and the terminal 114 of the transistor 110. In some embodiments, the capacitor 120 can be electrically connected between the voltage V3 and the diode 130. In some embodiments, the capacitor 120 can be electrically connected between the voltage V3 and the transistor 140 (e.g., the gate 142 and the terminal 144 of the transistor).

In some embodiments, the terminal 122 can be electrically coupled to or connected to the transistor 110 (e.g., the gate 142 and the terminal 144 of the transistor). In some embodiments, the terminal 122 can be electrically coupled to or connected to the terminal 114 of the transistor 110.

In some embodiments, the terminal 124 can be electrically coupled to or connected to the voltage V3. In some embodiments, the voltage V3 is electrically connected to ground.

In some embodiments, the transistor 110 and the capacitor 120 can collectively serve as a memory cell 10. For example, during a read operation, a word line, which is electrically coupled to or connected to the voltage V1, can be asserted, turning on the transistor 110. The enabled transistor 110 allows the voltage across the capacitor 120 to be read by a sense amplifier through a bit line, which is electrically coupled to or connected to the voltage V2. During a write operation, the data to be written can be provided on the bit line when the word line is asserted.

In some embodiments, the diode 130 can be electrically coupled to or connected to the transistor 110. In some embodiments, the diode 130 can be electrically coupled to or connected to the capacitor 120 (e.g., the terminal 122 of the transistor 120). In some embodiments, the diode 130 can be electrically coupled to or connected to the transistor 140. The diode 130 can include a terminal 132 and a terminal 134. In some embodiments, the diode 130 can be electrically connected between a signal, such as a voltage V4, and the capacitor 120. In some embodiments, the diode 130 can be electrically connected between the voltage V4 and the transistor 110. In some embodiments, the diode 130 can be configured to charge the capacitor 120.

In some embodiments, the terminal 132 can be a cathode of the diode 130. In some embodiments, the terminal 132 can be connected to the terminal 114 of the transistor 110. In some embodiments, the terminal 132 can be connected to the source of the transistor 110. In some embodiments, the terminal 132 can be connected to the transistor 140 (e.g., a terminal 144 of the transistor 140).

In some embodiments, the terminal 134 can be an anode of the diode 130. In some embodiments, the terminal 134 can be electrically coupled to or connected to the voltage V4. In some embodiments, the voltage V4 can be a direct current (DC). In some embodiments, the voltage V4 has a voltage level higher than the voltage V3.

In some embodiments, the transistor 140 can be electrically coupled to or connected to the transistor 110. In some embodiments, the transistor 140 can be electrically coupled to or connected to the terminal 114 of the transistor 110. In some embodiments, the transistor 140 can be electrically coupled to or connected to the capacitor 120. In some embodiments, the transistor 140 can be electrically coupled to or connected to the terminal 122 of the capacitor 120. In some embodiments, the transistor 140 can be electrically coupled to or connected to the diode 130. In some embodiments, the transistor 140 can be electrically coupled to or connected to the voltage V4. In some embodiments, the transistor 140 can be electrically connected between the voltage V4 and the terminal 114 of the transistor 110. In some embodiments, the transistor 140 can be electrically connected between the voltage V4 and the terminal 122 of the capacitor 120. In some embodiments, the transistor 140 can be configured to charge the capacitor 120.

In some embodiments, the transistor 140 can include a gate 142, a terminal 144, and a terminal 146. In some embodiments, the gate 142 can be configured to receive a signal from the diode 130, thereby turning on the transistor 140. In some embodiments, the gate 142 can be electrically coupled to or connected to the terminal 132 of the diode 130.

In some embodiments, the terminal 144 can be electrically coupled to or connected to the transistor 110. In some embodiments, the terminal 144 can be electrically coupled to or connected to the terminal 114 of the transistor 110. In some embodiments, the terminal 144 can be electrically coupled to or connected to the capacitor 120. In some embodiments, the terminal 144 can be electrically coupled to or connected to the terminal 122 of the capacitor 120. In some embodiments, the terminal 144 can be electrically coupled to or connected to the terminal 132 of the diode 130.

In some embodiments, the terminal 146 can be configured to receive the voltage V4. In some embodiments, the transistor 140 can be an NMOS. The terminal 144 can be a source of the transistor 140. The terminal 146 can be a drain of the transistor 140. In some embodiments, the transistor 140 can be a PMOS. The terminal 144 can be a drain of the transistor 140. The terminal 146 can be a source of the transistor 140.

As shown in FIG. 1, a node N1 can be connected between the terminal 114 of the transistor 110 and the capacitor 120. A node N2 can be connected between the terminal 114 of the transistor 110 and the diode 130. A node of N3 can be connected between the terminal 114 of the transistor 110 and the transistor 140. A node N4 can be connected between the diode 130 and the transistor 140. A node N5 can be connected between the voltage V4 and the transistor 140. In some embodiments, the voltage level of the nodes N1, N2, and N3 can be the same.

In some embodiments, the transistor 140 can be an equalizer. In some embodiments, the voltage level of the node N3 is equal to that of the node N5. In some embodiments, the voltage level of the node N2 is equal to that of the node N5. In some embodiments, the voltage level of the node N1 is equal to that of the node N5. In some embodiments, the transistor 140 can be turned on after the diode 130 has been turned on.

In some embodiments, the voltages V1 and V4 can be connected to the same power supply. In some embodiments, each of the voltages V1 and V4 can be 1.2 V or 0 V.

In some embodiments, a higher voltage (e.g., logical value "1"), such as 1.2 V, can be input at the voltage V2 to turn on the transistor 110, thereby writing data "1" or "0" of the memory cell 10. Charge(s) or an imbalance of charges can be stored in the capacitor 120, thereby storing the data "1" or "0." In some situations, parasitic capacitance may cause the loss of charges stored in the capacitor 120, reducing the potential difference between the terminal 122 and the terminal 124 of the capacitor 120. When the data is "1," the voltage at nodes, N1, N2, and N3 may drop down after the transistor 110 has been turned off due to the junction or cell leakage. In order to refresh the data "1," the reduced potential difference of the capacitor 120 needs to be pulled up.

In some comparative embodiments, the transistor 112 would be periodically turned on to refresh the date "1" at the node N1. However, frequently turning on/off the transistor 112 would increase the power consumption of the circuit 100. In accordance with the embodiments as illustrated in FIG. 1, the circuit 100 includes the diode 130 and the transistor 140 connected to the memory cell 10, which can assist in pulling up the voltage at nodes, N1, N2, and N3. In operation, when the voltage at nodes, N1, N2, and N3 is 1.2 V, the diode 130 is turned off. As the loss of the charges increases, causing the voltage at nodes N1, N2, and N3 to be lower than a first threshold voltage, such as 0.5V, 0.6 V, or 0.7 V, the diode 130 would be turned on. After the diode 130 has been turned on, the voltage at the node N4 increases, and then the transistor 140 would be turned on to pull up the voltage at nodes, N1, N2, and N3, thereby refreshing the data "1" automatically. After the voltage at nodes, N1, N2, and N3 exceeds or equals a second threshold voltage, such as 0.9 V, 1V, 1.1 V, or 1.2 V, the diode 130 would be turned off. The transistor 140 would be turned off automatically. By using the diode 130 and the transistor 140 to automatically refresh the data "1" at the node N1, it is unnecessary to frequently turn on/off the transistor 110, which can reduce the power consumption of the circuit 100.

Figure 2A:
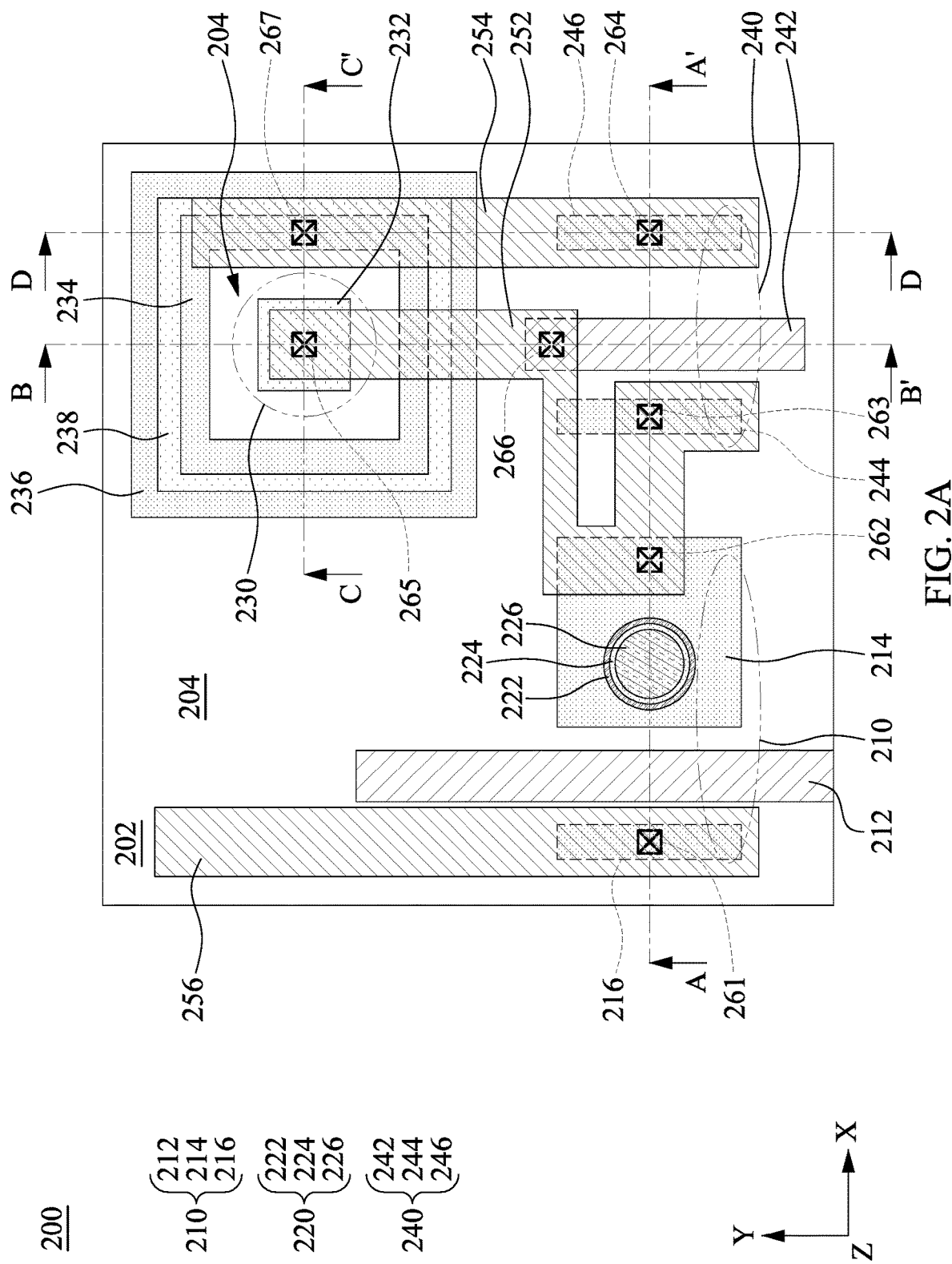
FIG. 2A is a layout of a semiconductor device in accordance with some embodiments of the present disclosure.

FIG. 2A is a layout of a semiconductor device 200 in accordance with some embodiments of the present disclosure. FIG. 2B, FIG. 2C, FIG. 2D, and FIG. 2E are cross-sectional views along lines A-A', B-B', C-C', and D-D', respectively, of the semiconductor device 200 as shown in FIG. 2A. In some embodiments, the semiconductor device 200 can include a substrate 202, a transistor 210, a capacitor structure 220, a diode 230, and a transistor 240.

The substrate 202 may be a semiconductor substrate, such as a bulk semiconductor, a semiconductor-on-insulator (SOI) substrate, or the like. The substrate 202 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 202 may have a multilayer structure, or the substrate 202 may include a multilayer compound semiconductor structure.

Figure 2B:
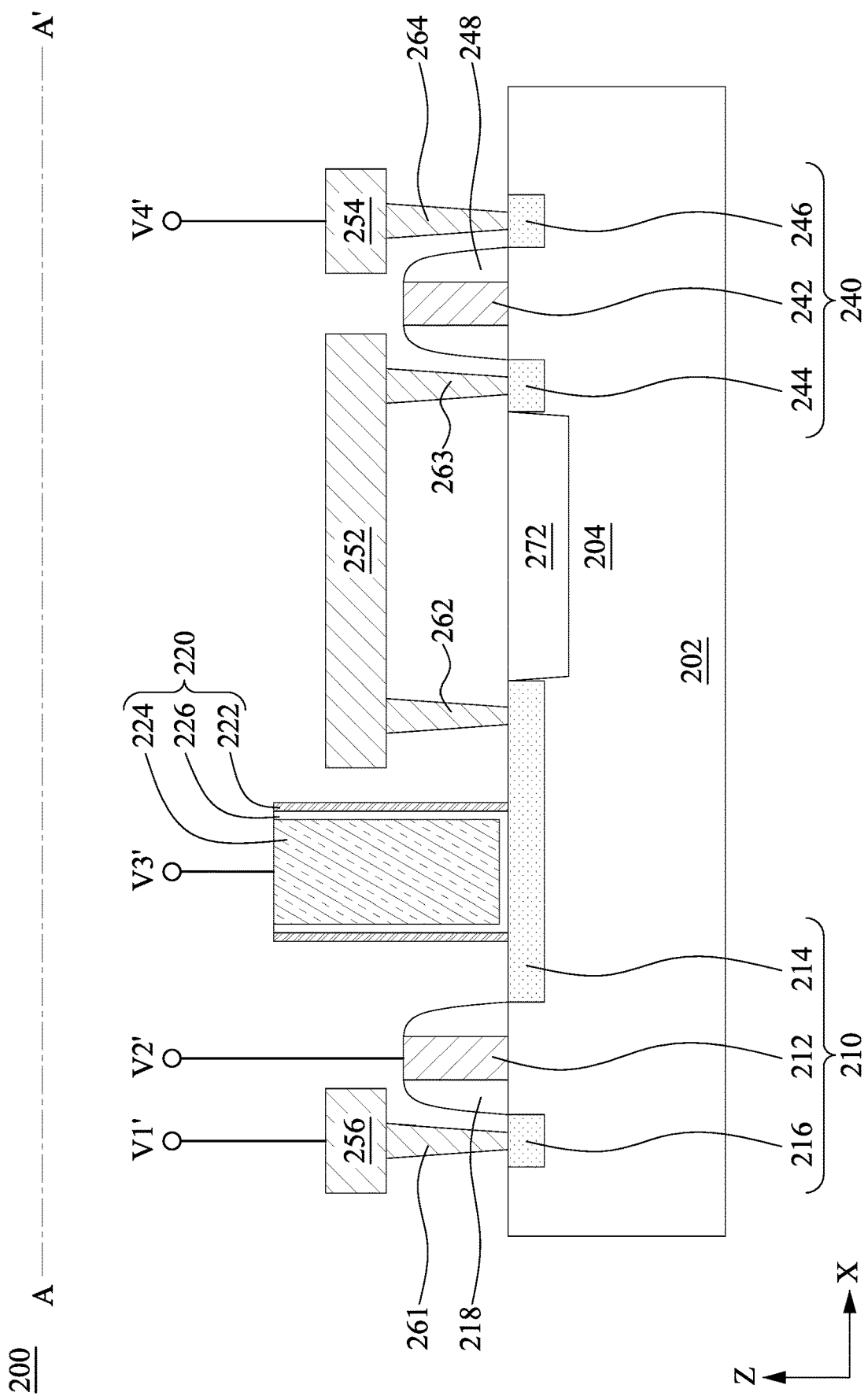
FIG. 2B is a cross-sectional view along line A-A' of the semiconductor device as shown in FIG. 2A in accordance with some embodiments of the present disclosure.

As shown in FIG. 2A and FIG. 2B, the semiconductor device 200 can include a well region 204. In some embodiments, the well region 204 can include a first conductive type. In some embodiments, the first conductive type is a p type. In some embodiments, p type dopants include boron (B), other group III elements, or any combination thereof. In some embodiments, the first conductive type is an n type. In some embodiments, n type dopants include arsenic (As), phosphorus (P), other group V elements, or any combination thereof.

As shown in FIG. 2A and FIG. 2B, the transistor 210 can include a gate structure 212, a doped region 214, and a doped region 216. The transistor 210 can correspond to the transistor 110 as shown in FIG. 1. The gate structure 212 can correspond to the gate 112 as shown in FIG. 1. The doped region 214 can serve as a terminal of the transistor 210 and correspond to the terminal 114 as shown in FIG. 1. The doped region 216 can serve as a terminal of the transistor 210 and correspond to the terminal 116 as shown in FIG. 1. The pair of the doped regions 214 and 216 can also be referred to as a source/drain feature.

The gate structure 212 can be disposed on the substrate 202. In some embodiments, the gate structure 212 can be electrically connected to a voltage V2'. In some embodiments, the voltage V2' can be the same as the voltage V2 as shown in FIG. 1.

In some embodiments, the gate structure 212 can include a gate dielectric (not shown) and a gate electrode (not shown). The gate dielectric can have a single layer or a multi-layer structure. In some embodiments, the gate dielectric can include dielectric material such as silicon oxide, silicon nitride, silicon oxynitride, other dielectric materials, or a combination thereof. In some embodiments, the gate dielectric is a multi-layer structure that includes an interfacial layer and a high-k (dielectric constant greater than 4) dielectric layer. The interfacial layer can include dielectric material such as silicon oxide, silicon nitride, silicon oxynitride, other dielectric materials, or a combination thereof. The high-k dielectric layer can include high-k dielectric material such as $HfO_2$, HfSiO, HfSiON, HfTaO, HfSiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

The gate electrode can be disposed on the gate dielectric. The gate electrode can include polysilicon, silicon-germanium, and/or at least one metallic material including elements and compounds such as Mo, Cu, W, Ti, Ta, TiN, TaN, NiSi, CoSi, or other suitable conductive materials known in the art. In some embodiments, the gate electrode includes a work function metal layer that provides a metal gate with an n-type-metal work function or p-type-metal work function. The p-type-metal work function materials include materials such as ruthenium, palladium, platinum, cobalt, nickel, conductive metal oxide, or other suitable materials. The n-type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials.

The doped region 214 can be disposed in the substrate 202. The doped region 214 can be embedded in the well region 204. In some embodiments, the doped region 214 can be configured to electrically couple to the capacitor structure 220. In some embodiments, the doped region 214 can be configured to electrically couple to the diode 230. In some embodiments, the doped region 214 can be configured to electrically couple to the transistor 240. In some embodiments, the doped region 214 can include a second conductive type different from the first conductive type. For example, the first conductive type can be a p type, and the second conductive type can be an n type.

The doped region 216 can be disposed in the substrate 202. The doped region 216 can be embedded in the well region 204. In some embodiments, the doped region 216 can include the second conductive type. The doped regions 214 and 216 can be disposed on two opposite sides of the gate structure 212. In some embodiments, the doped region 216 can be configured to electrically couple to a signal, such as the voltage V1'. In some embodiments, the voltage V1' can be the same as the voltage V1 as shown in FIG. 1. In some embodiments, the doped region 216 can be electrically coupled to or connected to a bit line (not shown) of the transistor 210.

The semiconductor device can include a spacer 218. The spacer 218 can be disposed on the lateral surface of the gate structure 212. The spacer 218 can include a single layer structure or a multilayer structure. The spacer 218 can include dielectric material such as silicon oxide, silicon nitride, silicon oxynitride, other dielectric materials, or a combination thereof.

As shown in FIG. 2A and FIG. 2B, the capacitor structure 220 can be disposed on the substrate 202. In some embodiments, the capacitor structure 220 can be configured to electrically couple to the doped region 214 of the transistor

210. In some embodiments, the capacitor structure 220 can be disposed on the doped region 214 of the substrate 202. In some embodiments, the capacitor structure 220 can be disposed directly over the doped region 214 of the substrate 202. In some embodiments, the capacitor structure 220 can include an electrode 222, an electrode 224, and an insulation layer 226. The capacitor structure 220 can correspond to the capacitor 120 as shown in FIG. 1. The electrode 222 can serve as a first terminal of the capacitor structure 220 and correspond to the terminal 122 as shown in FIG. 1. The electrode 224 can serve as a second terminal of the capacitor structure 220 and correspond to the terminal 124 as shown in FIG. 1. In some embodiments, the transistor 210 is closer to the capacitor structure 220 than the transistor 240 is.

In some embodiments, the electrode 222 can be electrically coupled to or connected to the doped region 214 of the transistor 210. In some embodiments, the electrode 222 can be in contact with the doped region 214 of the transistor 210. The electrode 222 can include a semiconductor material or a conductive material. The semiconductor material can include polysilicon or other suitable materials. The conductive material can include tungsten, copper, aluminum, tantalum, or other suitable materials.

The insulation layer 226 can surround the electrode 224. The insulation layer 226 can separate the electrode 222 from the electrode 224. The insulation layer 226 can include dielectric materials, such as silicon oxide, tungsten oxide, zirconium oxide, copper oxide, aluminum oxide, hafnium oxide, or the like.

In some embodiments, the electrode 224 can be electrically coupled to or connected to a signal, such as the voltage V3'. The electrode 224 can be spaced apart from the electrode 222 by the insulation layer 226. The electrode 224 can include a semiconductor material or a conductive material. The semiconductor material can include polysilicon or other suitable materials. The conductive material can include tungsten, copper, aluminum, tantalum, or other suitable materials. In some embodiments, the voltage V3' can be ground.

As shown in FIG. 2A, FIG. 2C, FIG. 2D, FIG. 2E, the diode 230 can be disposed in the substrate 202. In some embodiments, the doped region 232 can be configured to electrically couple to the transistor 210. In some embodiments, the doped region 232 can be configured to electrically couple to the doped region 216 of the transistor 210. In some embodiments, the doped region 232 can be configured to electrically couple to the capacitor structure 220. In some embodiments, the doped region 232 can be configured to electrically couple to the electrode 222 of the capacitor structure 220. In some embodiments, the doped region 232 can be configured to electrically couple to the transistor 240. In some embodiments, the doped region 232 can be configured to electrically couple to the gate (e.g., gate structure 242) of the transistor 240. In some embodiments, the doped region 214 can include the second conductive type. In some embodiments, a portion of the well region 204 and the doped region 232 can collectively serve as the diode 230. In some embodiments, the doping concentration of the doped region 232 can exceed that of the well region 204. In some embodiments, the doped region 232 can serve as a terminal and correspond to the terminal 132 as shown in FIG. 1.

In some embodiments, the semiconductor device 200 can include a doped region 234. The doped region 234 can be disposed in the substrate 202. In some embodiments, the doped region 234 can surround the doped region 232 in a top view. In some embodiments, the doped region 234 can have the first conductive type. In some embodiments, the doped region 234 can be configured to electrically couple to a terminal (e.g., doped region 246) of the transistor 240. In some embodiments, the doping concentration of the doped region 234 can exceed than that of the well region 204. In some embodiments, the doped region 234 can be electrically connected to a voltage V4'. In some embodiments, the voltage V4' can be a DC voltage. In some embodiments, the voltage level of the voltage V4' can be greater than that of the voltage V3'.

In some embodiments, the semiconductor device 200 can include an isolation feature 271. The isolation feature 271 can be disposed in the substrate 202. In some embodiments, the isolation feature 271 can surround the doped region 234. In some embodiments, the isolation feature 271 can be a shallow trench isolation (STI). In other embodiments, the isolation feature 271 can include a structure of a local oxidization of silicon (LOCOS) structure, or any other suitable isolation structure.

In some embodiments, the semiconductor device 200 can include a doped region 236. The doped region 236 can be disposed in the substrate 202. In some embodiments, the doped region 236 can be disposed beneath the isolation feature 271. In some embodiments, the doped region 236 can surround the doped region 234 in a top view. In some embodiments, the doped region 236 can have the second conductive type.

In some embodiments, the semiconductor device 200 can include a well region 238. The well region 238 can be disposed in the substrate 202. In some embodiments, the well region 238 can be disposed beneath the doped region 236. In some embodiments, the well region 238 can be spaced apart from the doped region 234 by the well region 204. In some embodiments, the well region 238 can be spaced apart from the doped region 232 by the well region 204. In some embodiments, the well region 238 can have the second conductive type. In some embodiments, the doping concentration of the well region 238 can be less than that of the doped region 236. In some embodiments, the isolation feature 237, the doped region 236, and the well region 238 can be configured to prevent a conductive path between the diode 230 and the transistor 210 (or 240 240) through the substrate 202.

As shown in FIG. 2A, FIG. 2B, FIG. 2C, and FIG. 2E, the transistor 240 can include a gate structure 242, a doped region 244, and a doped region 246. The transistor 240 can correspond to the transistor 140 as shown in FIG. 1. The gate structure 242 can correspond to the gate 142 as shown in FIG. 1. The doped region 244 can serve as a terminal of the transistor 240 and correspond to the terminal 144 as shown in FIG. 1. The doped region 246 can serve as a terminal of the transistor 240 and correspond to the terminal 146 as shown in FIG. 1. The pair of the doped regions 244 and 246 can also be referred to as a source/drain feature.

The gate structure 242 can be disposed on the substrate 202. In some embodiments, the gate structure 242 can include a gate dielectric (not shown) and a gate electrode (not shown). In some embodiments, the material of the gate structure 242 can be the same as or similar to that of the gate structure 212.

The doped region 244 can be disposed in the substrate 202. The doped region 244 can be embedded in the well region 204. In some embodiments, the doped region 244 can be configured to electrically couple to the doped region 214 of the transistor 210. In some embodiments, the doped region 244 can be configured to electrically couple to the electrode 222 of the capacitor structure 220. In some embodiments, the doped region 244 can include the second conductive type. In some embodiments, the doped region 244 can be spaced apart from the doped region 214 by an isolation feature 272.

The doped region 246 can be disposed in the substrate 202. The doped region 246 can be embedded in the well region 204. In some embodiments, the doped region 246 can include the second conductive type. The doped regions 244 and 246 can be disposed on two opposite sides of the gate structure 242.

The semiconductor device can include a spacer 248. The spacer 248 can be disposed on the lateral surface of the gate structure 242. The spacer 248 can include a single layer structure or a multilayer structure. The spacer 248 can include dielectric material such as silicon oxide, silicon nitride, silicon oxynitride, other dielectric materials, or a combination thereof.

As shown in FIG. 2A, the semiconductor 200 can include conductive layers 252, 254, and 256. The conductive layers 252, 254, and 256 can be disposed on the substrate 202. The conductive layers 252, 254, and 256 can be located in the same elevation height. The conductive layers 252, 254, and 256 can include conductive materials, such as tungsten, copper, aluminum, tantalum, or other suitable materials.

Figure 2C:
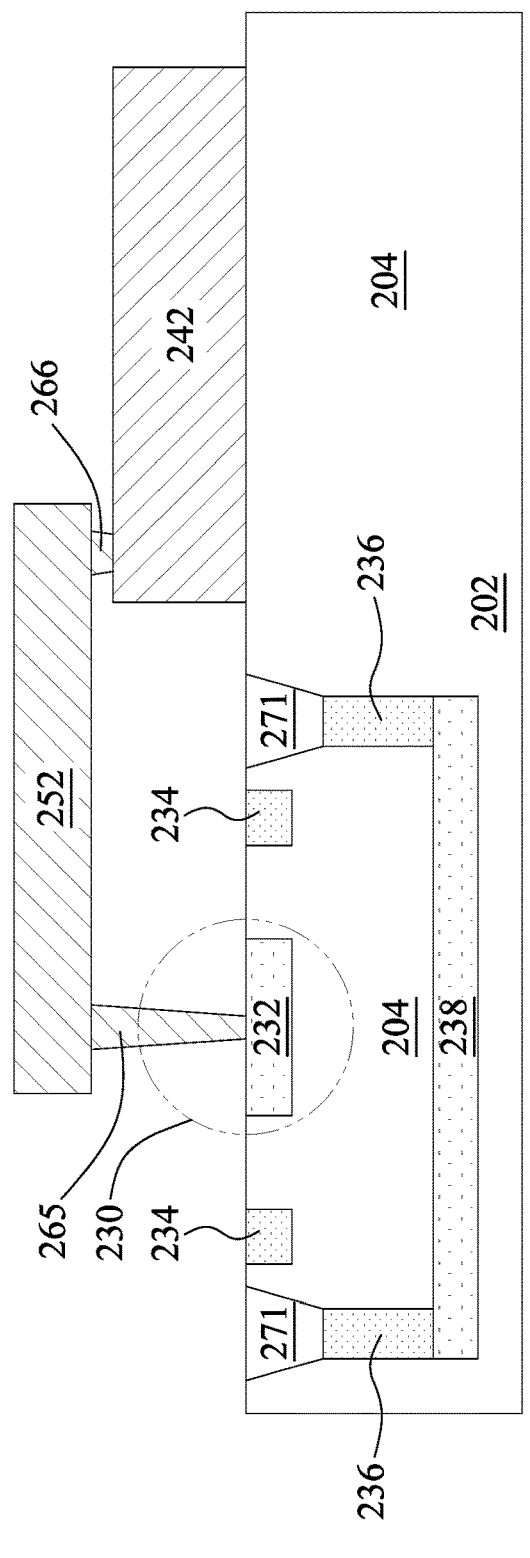
FIG. 2C is a cross-sectional view along line B-B' of the semiconductor device as shown in FIG. 2A in accordance with some embodiments of the present disclosure.
Figure 2D:
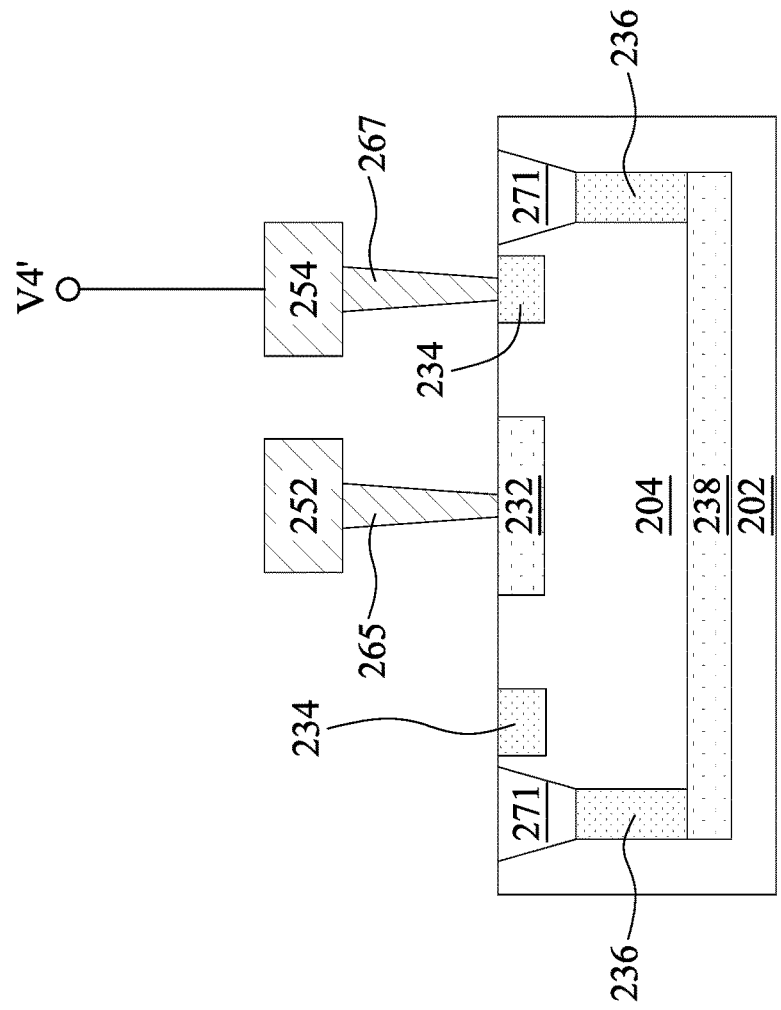
FIG. 2D is a cross-sectional view along line C-C' of the semiconductor device as shown in FIG. 2A in accordance with some embodiments of the present disclosure.

As shown in FIG. 2A, FIG. 2B, and FIG. 2C, the conductive layer 252 can be configured to electrically connect the doped region 214, the doped region 232, the gate structure 242, and the doped region 244 to each other.

Figure 2E:
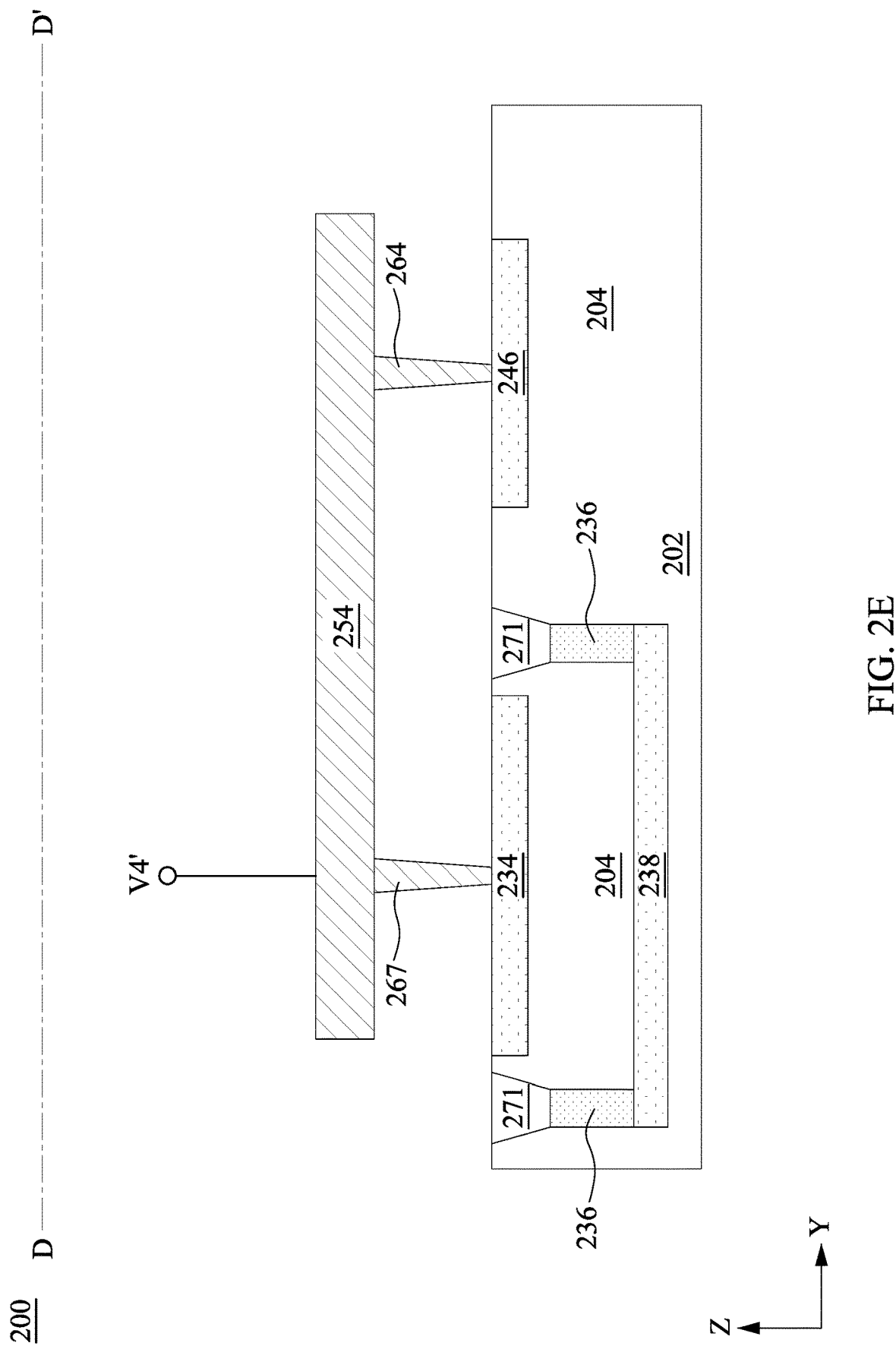
FIG. 2E is a cross-sectional view along line D-D' of the semiconductor device as shown in FIG. 2A in accordance with some embodiments of the present disclosure.

As shown in FIG. 2A and FIG. 2E, the conductive layer 254 can be configured to electrically connect the doped regions 234 and 246.

As shown in FIG. 2A and FIG. 2B, the conductive layer 256 can be configured to electrically connect the doped region 216 to the voltage V1'.

As shown in FIG. 2A, FIG. 2B, FIG. 2C, FIG. 2D, and FIG. 2E, the semiconductor device 200 can include conductive vias 261, 262, 263, 264, 265, 266, and 267. The conductive vias 261, 262, 263, 264, 265, 266, and 267 can include a liner layer (not shown), a barrier layer (not shown) and a conductive layer (not shown). The liner layer can include oxide or other suitable materials. The barrier layer can include titanium, tantalum, titanium nitride, tantalum nitride, manganese nitride or a combination thereof. The conductive layer may include metal, such as tungsten, copper, aluminum, tantalum, alloys thereof, or combinations thereof.

As shown in FIG. 2B, the conductive via 261 can be configured to electrically connect the doped region 216 and the conductive layer 256.

As shown in FIG. 2B, the conductive via 262 can be configured to electrically connect the doped region 214 and the conductive layer 252.

As shown in FIG. 2B, the conductive via 263 can be configured to electrically connect the doped region 244 and the conductive layer 252.

As shown in FIG. 2B, the conductive via 264 can be configured to electrically connect the doped region 246 and the conductive layer 254.

As shown in FIG. 2C, the conductive via 265 can be configured to electrically connect the doped region 232 and the conductive layer 252.

As shown in FIG. 2C, the conductive via 266 can be configured to electrically connect the gate structure 242 and the conductive layer 252.

As shown in FIG. 2E, the conductive via 267 can be configured to electrically connect the doped region 234 and the conductive layer 254.

In some embodiments, as shown in FIG. 2A, the doped region 232 can be aligned to the gate structure 242 of the transistor 240 along the Y-axis. In some embodiments, as shown in FIG. 2B, the capacitor structure 220 can be disposed between the gate structure 212 of the transistor 210 and the gate structure 242 of the transistor 240 along the X-axis.

In some embodiments, the transistor 210 and the capacitor structure 220 can serve as a memory cell. Charge(s) or an imbalance of charges can be stored in the capacitor structure 220, thereby storing the data "1" or "0." In some situations, parasitic capacitance may cause the loss of charges stored in the capacitor structure 220, reducing the potential difference between the electrodes 222 and 224 of the capacitor structure 220. When the data is "1," the potential difference of the capacitor structure 220 may drop down after the transistor 210 has been turned off. In order to refresh the data "1," the reduced potential difference of the capacitor structure 220 needs to be pulled up. In this embodiment, the semiconductor device 200 further includes the diode 230 and the transistor 240, which can assist in pulling up the potential difference of the capacitor 220. In this embodiment, when the voltage at a node between the diode 230 and the capacitor 220 is lower than a threshold voltage, the diode 230 will turn on. After the diode 230 has been turned on, the transistor 240 will turn on to pull up the potential difference of the capacitor structure 220, thereby refreshing the data "1" automatically.

Figure 3:
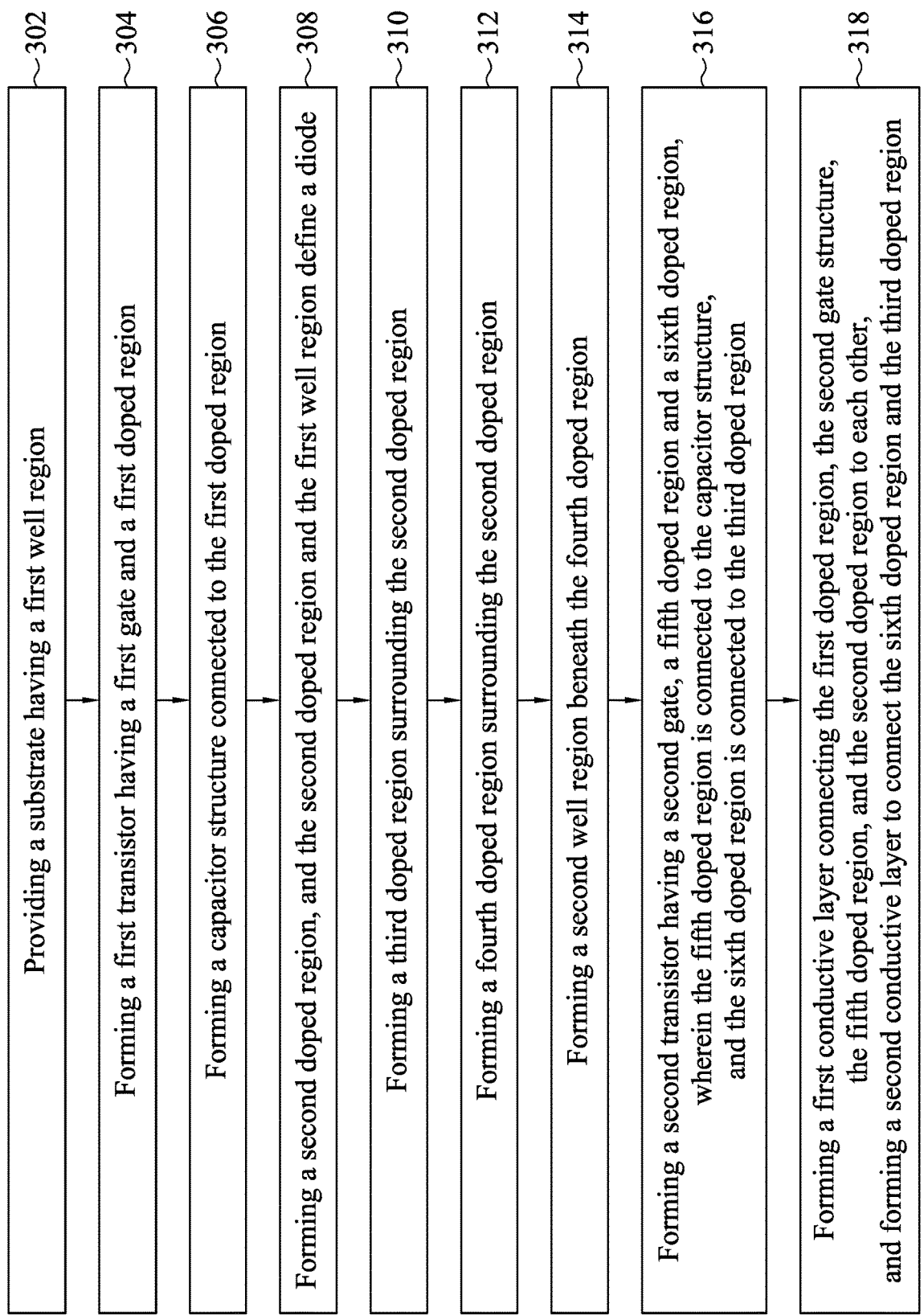
FIG. 3 is a flow chart illustrating a method for manufacturing a semiconductor device, in accordance with various aspects of the present disclosure.
Figure 4A:
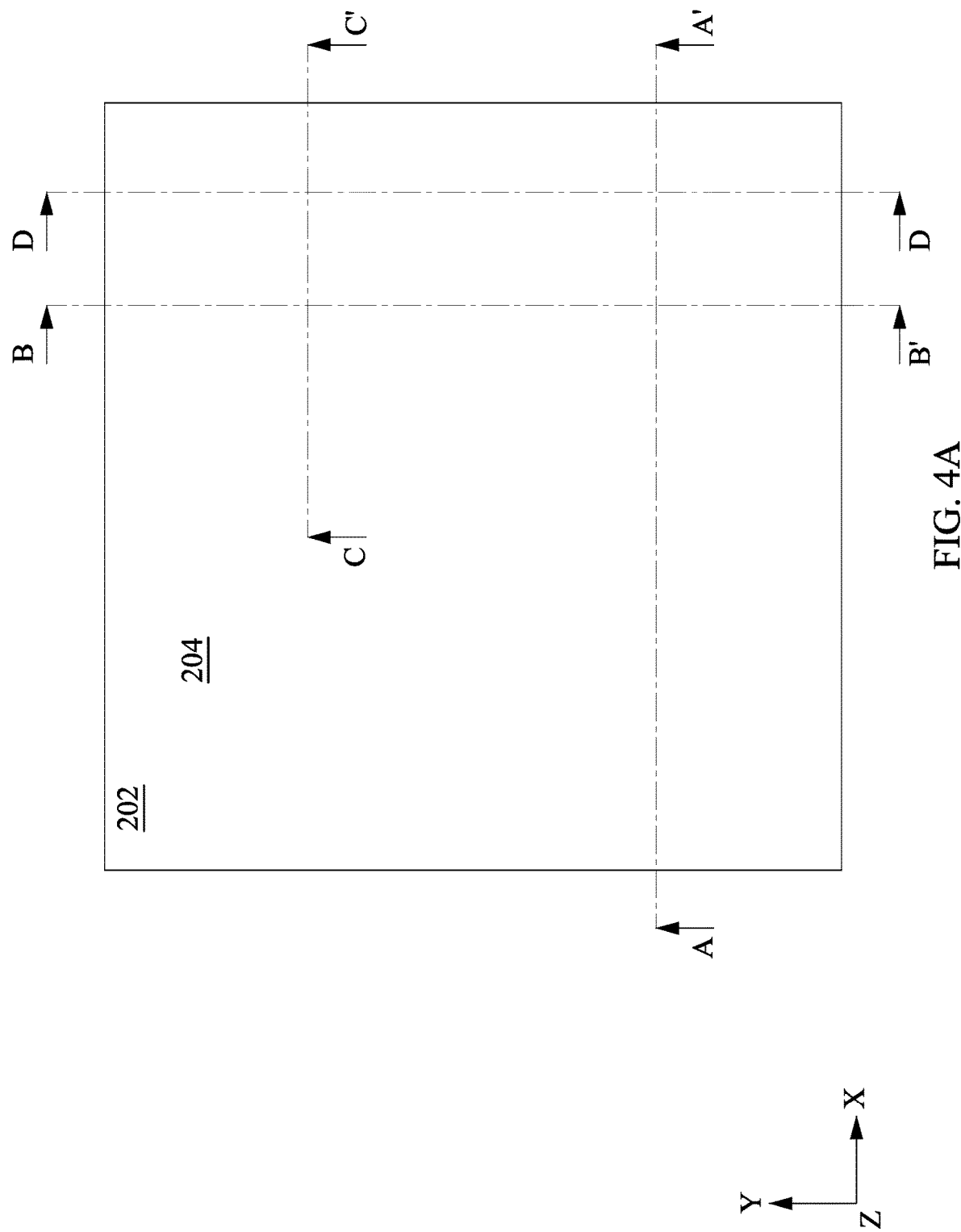
FIG. 4A, FIG. 5A, FIG. 6A, FIG. 7A, and FIG. 8A illustrate various stages of manufacturing a semiconductor device, in accordance with some embodiments of the present disclosure.
Figure 4B:
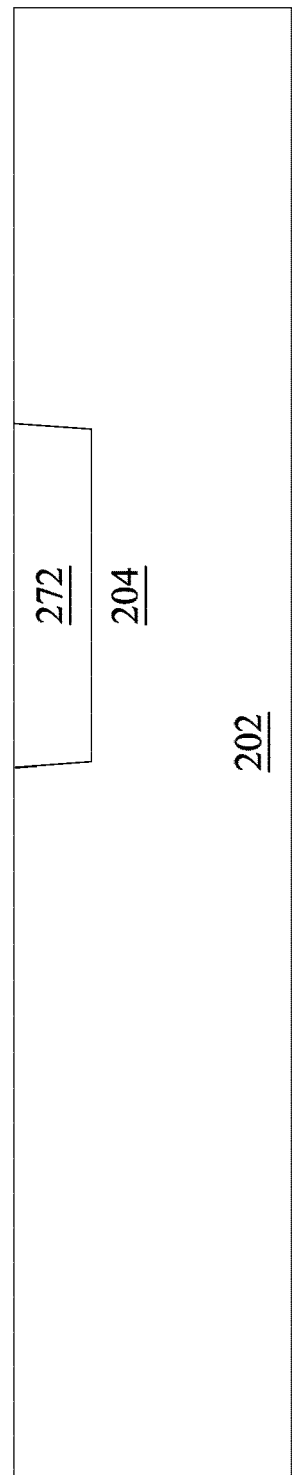
FIG. 4B, FIG. 5B, FIG. 6B, FIG. 7B, and FIG. 8B illustrate cross-sectional views along line A-A' of FIG. 4A, FIG. 5A, FIG. 6A, FIG. 7A, and FIG. 8A, respectively.
Figure 4C:
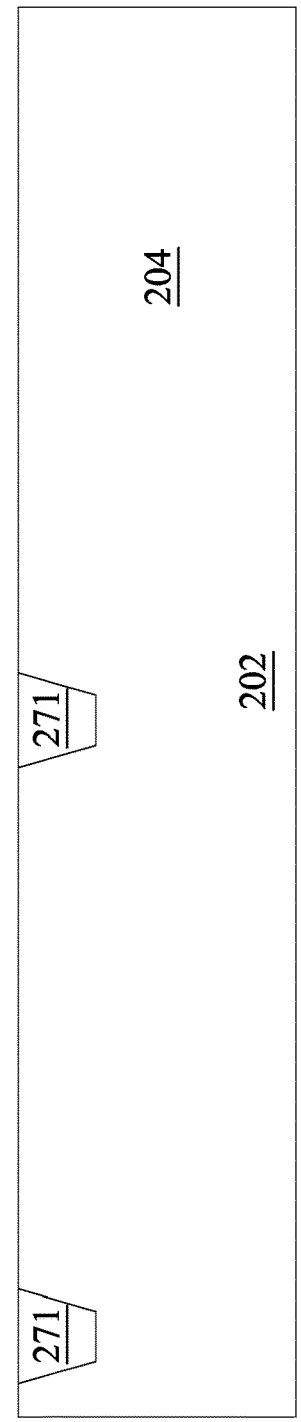
FIG. 4C, FIG. 5C, FIG. 6C, FIG. 7C, and FIG. 8C illustrate cross-sectional views along line B-B' of FIG. 4A, FIG. 5A, FIG. 6A, FIG. 7A, and FIG. 8A, respectively.
Figure 4D:
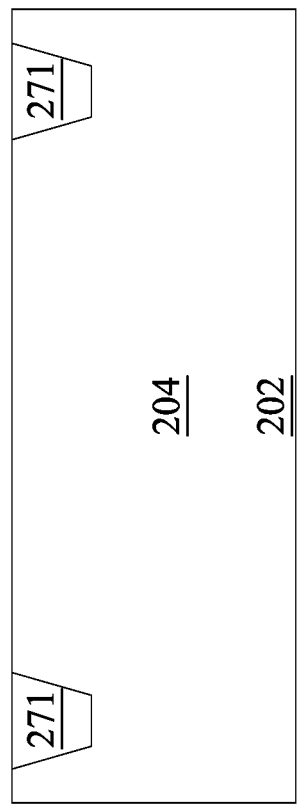
FIG. 4D, FIG. 5D, FIG. 6D, FIG. 7D, and FIG. 8D illustrate cross-sectional views along line C-C' of FIG. 4A, FIG. 5A, FIG. 6A, FIG. 7A, and FIG. 8A, respectively.
Figure 4E:
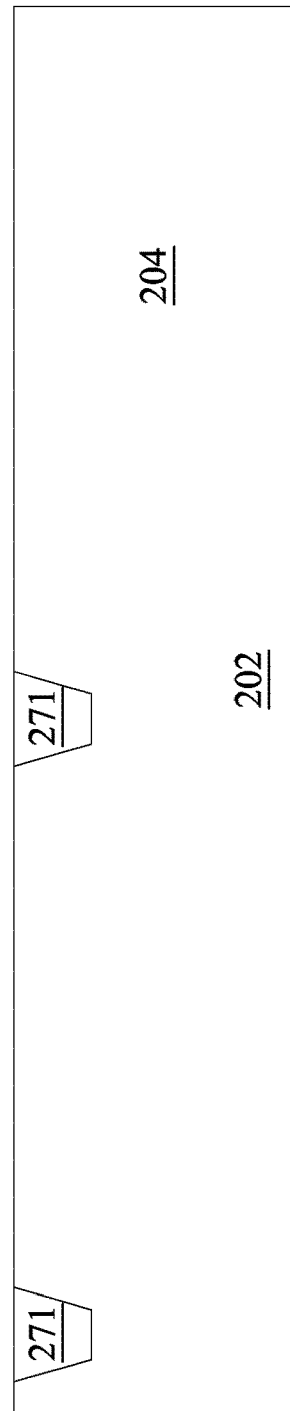
FIG. 4E, FIG. 5E, FIG. 6E, FIG. 7E, and FIG. 8E illustrate cross-sectional views along line D-D' of FIG. 4A, FIG. 5A, FIG. 6A, FIG. 7A, and FIG. 8A, respectively.
Figure 5A:
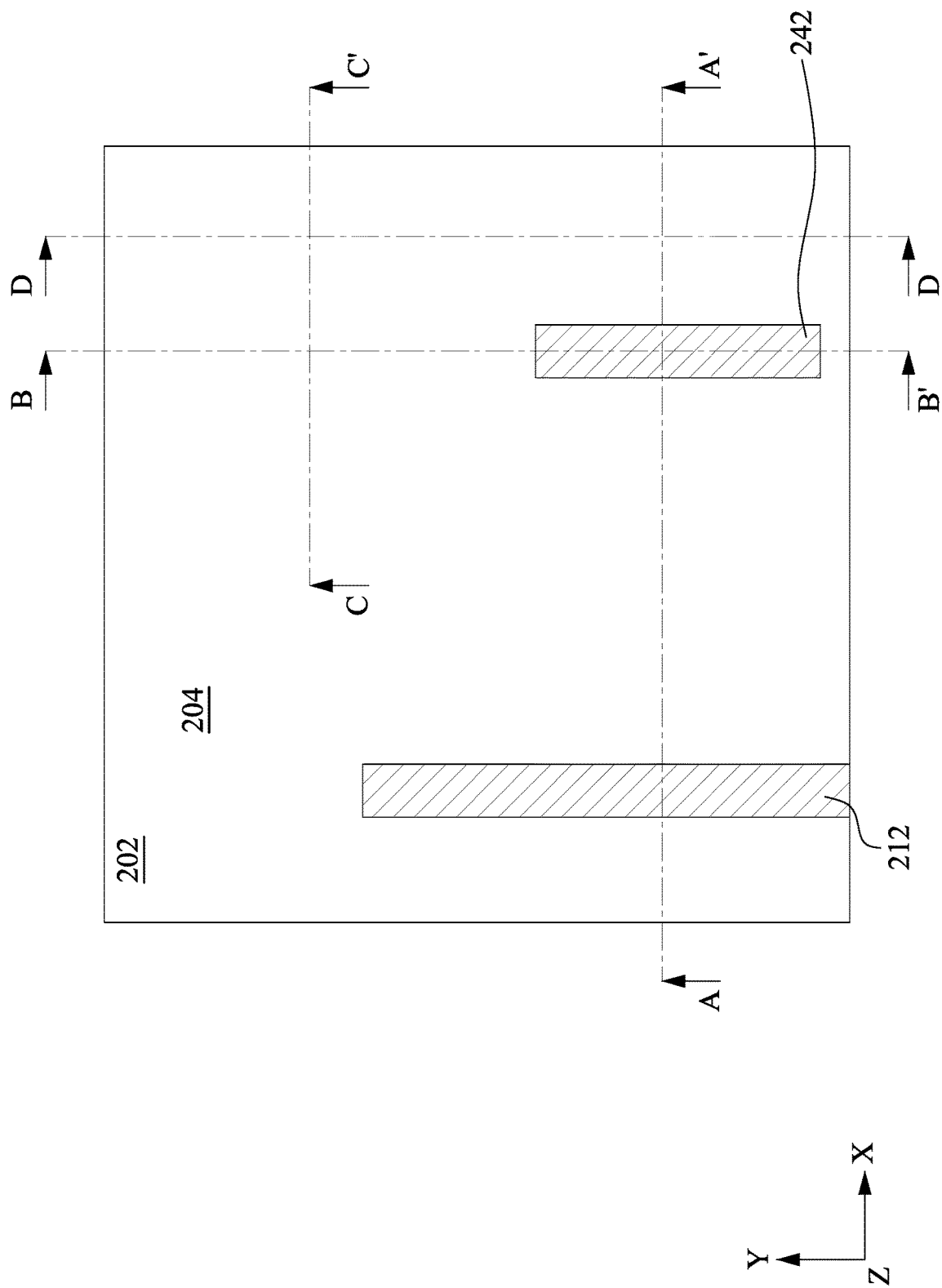
Figure 5B:
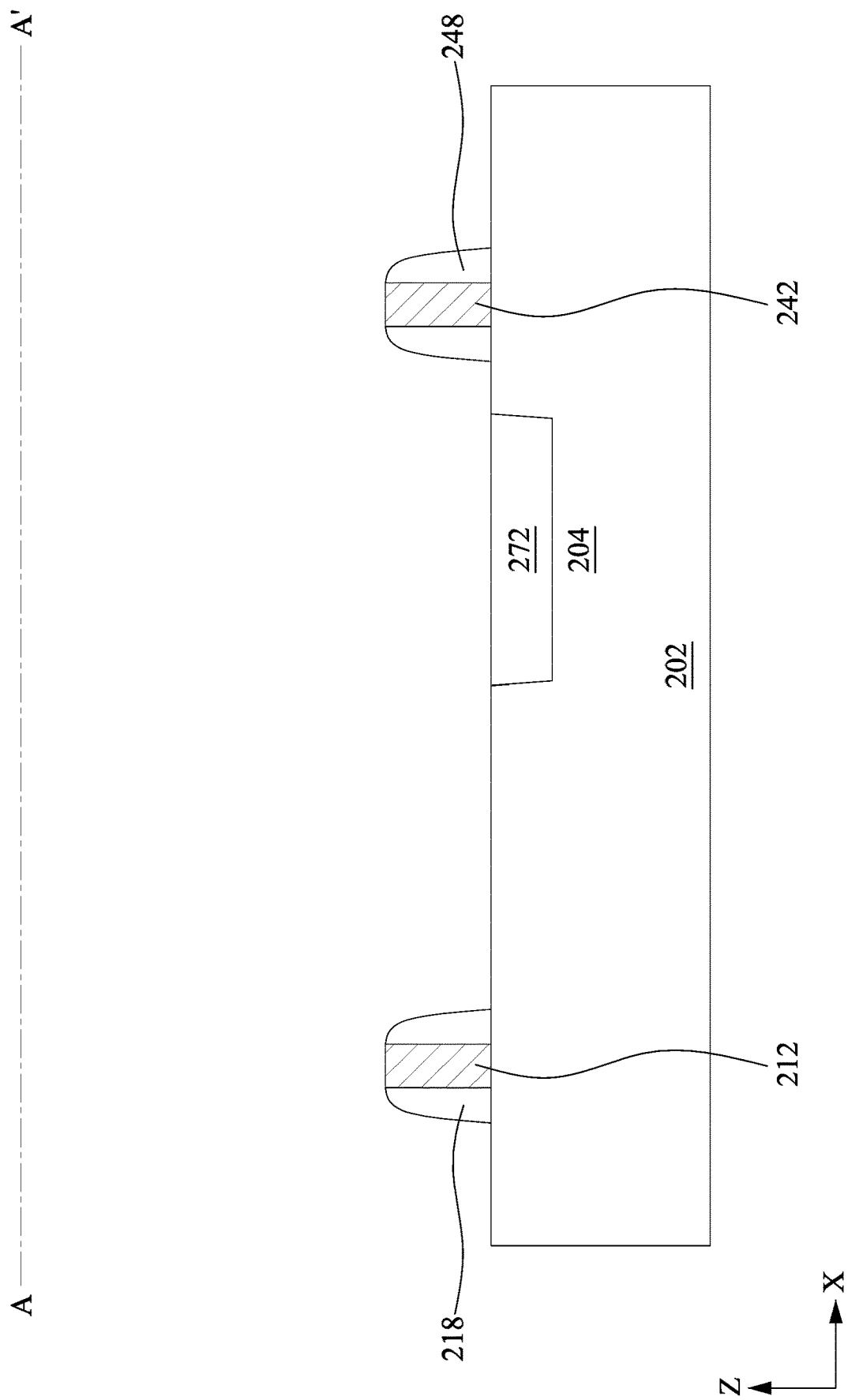
Figure 5C:
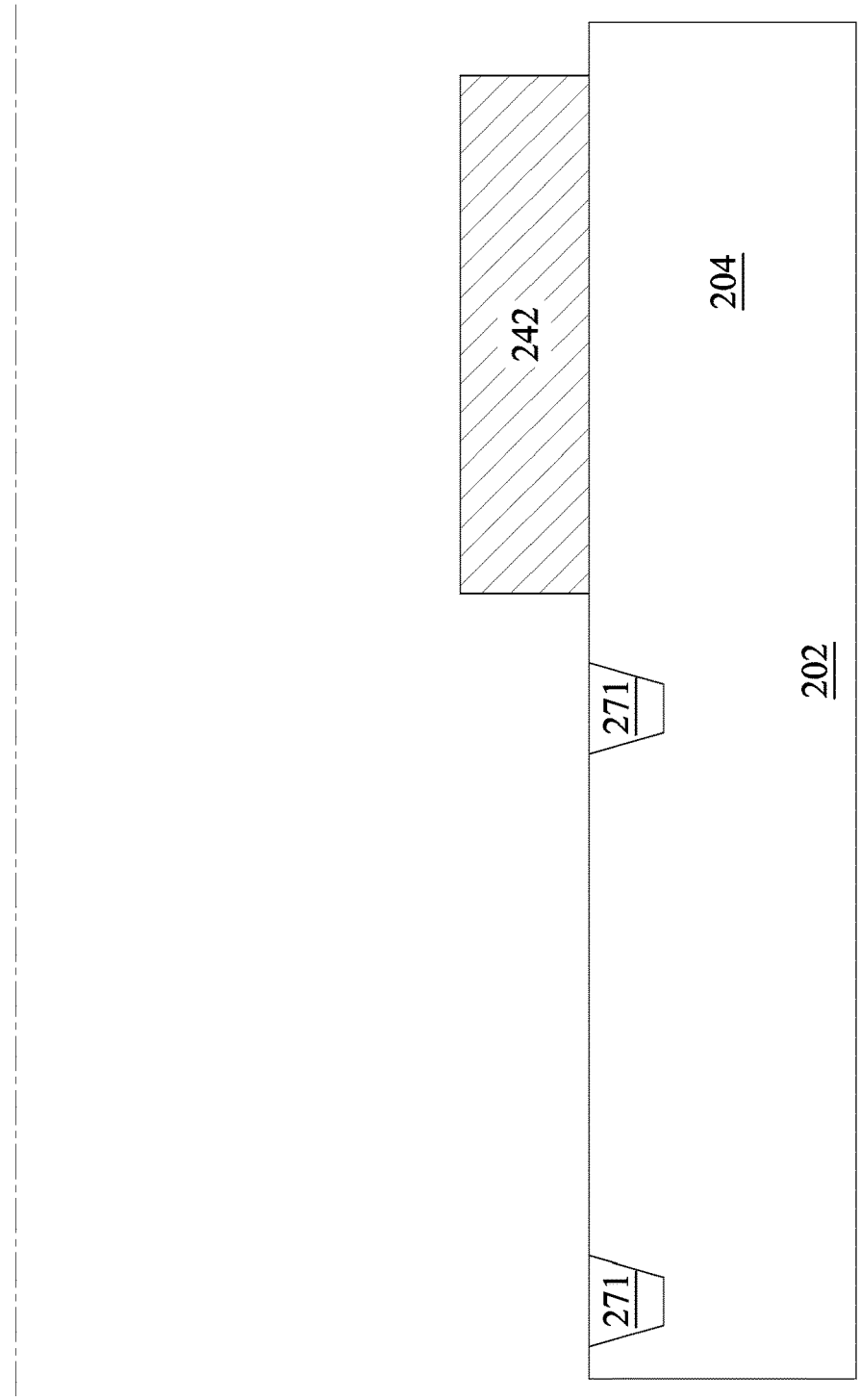
Figure 5D:
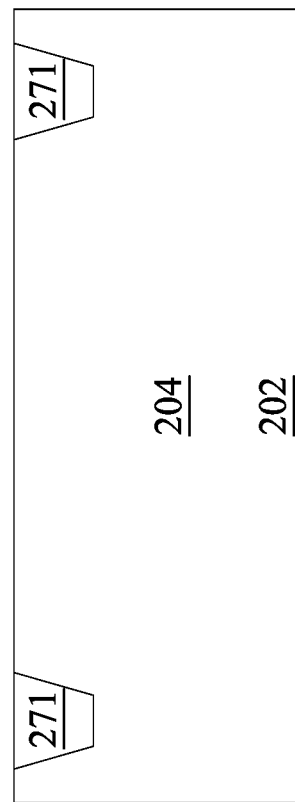
Figure 5E:
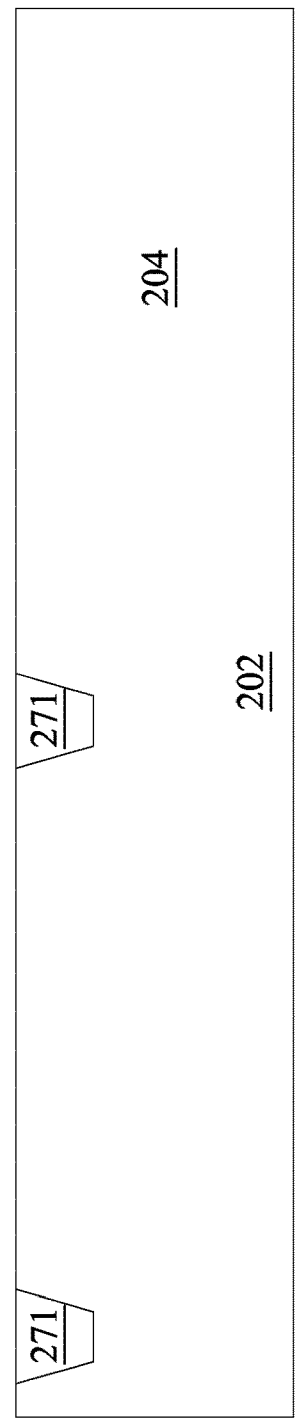
Figure 6A:
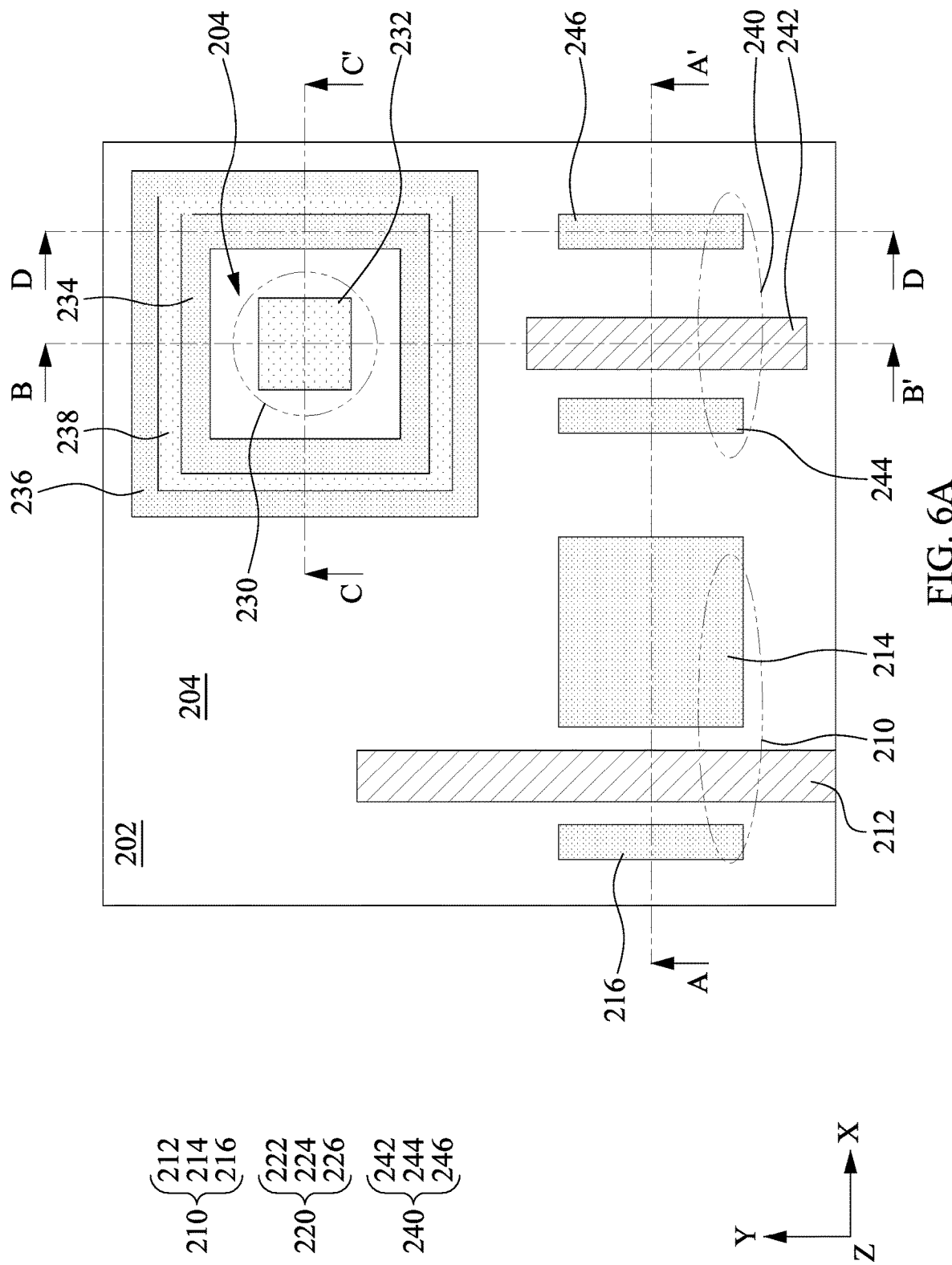
Figure 6B:
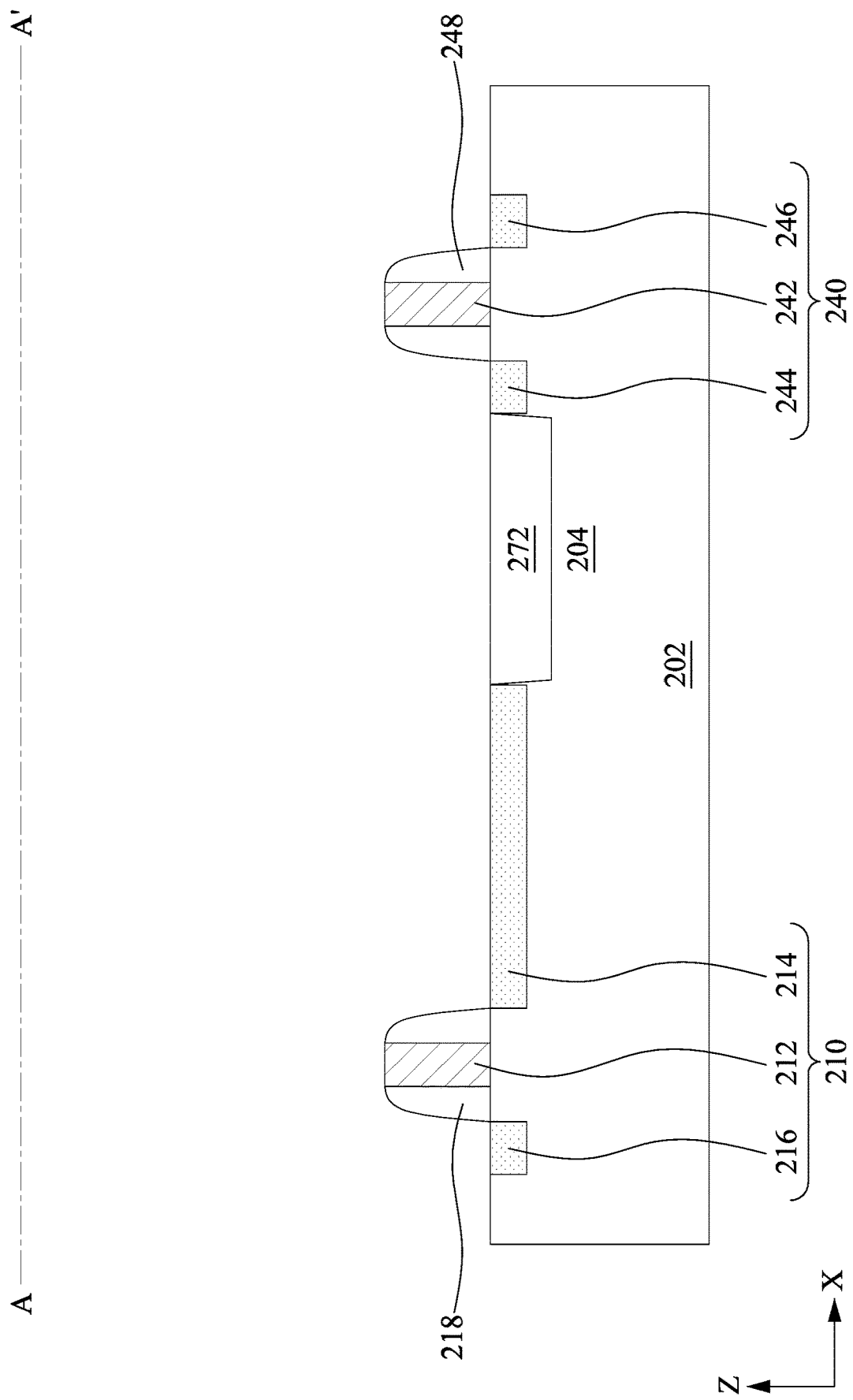
Figure 6C:
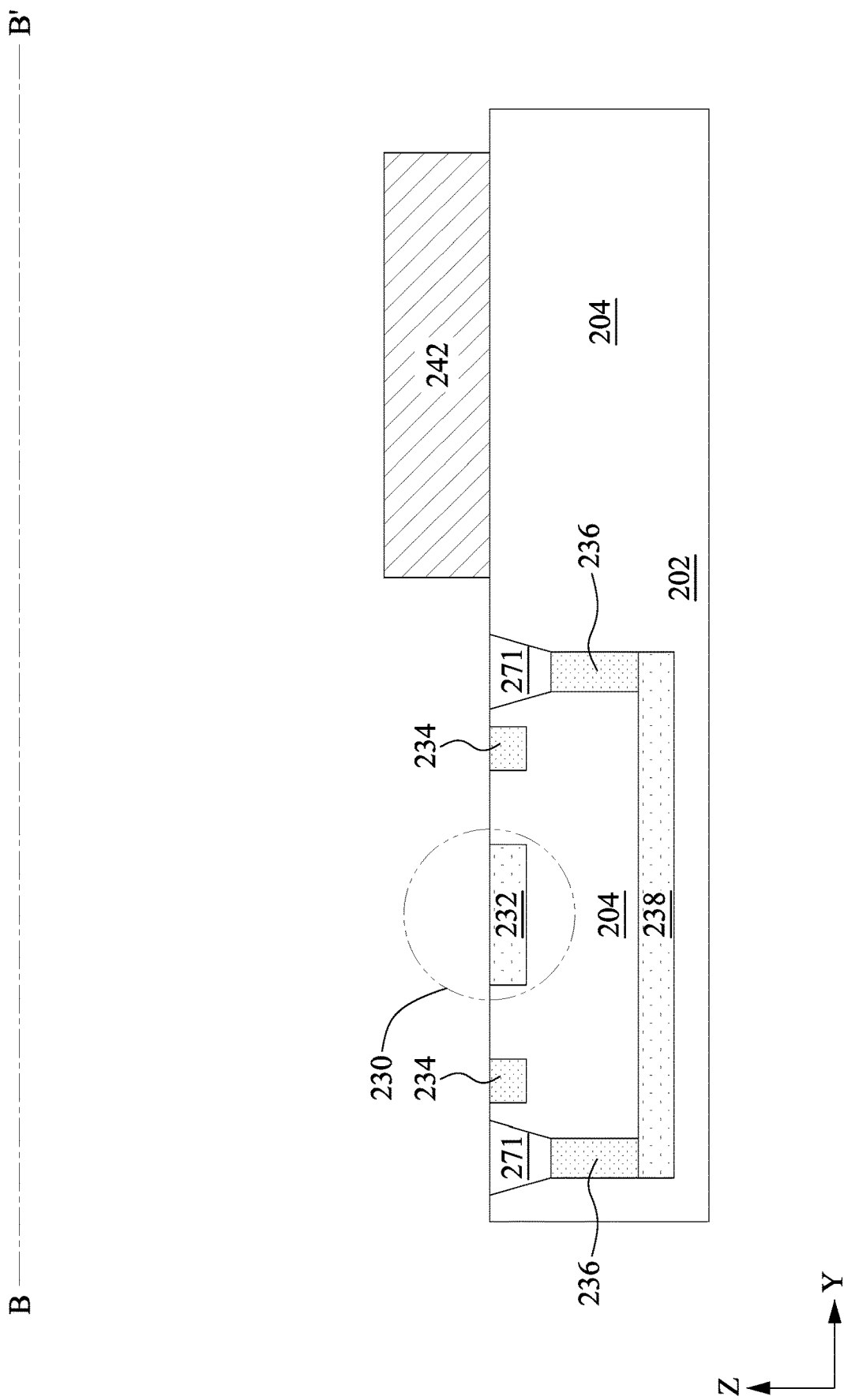
Figure 6D:
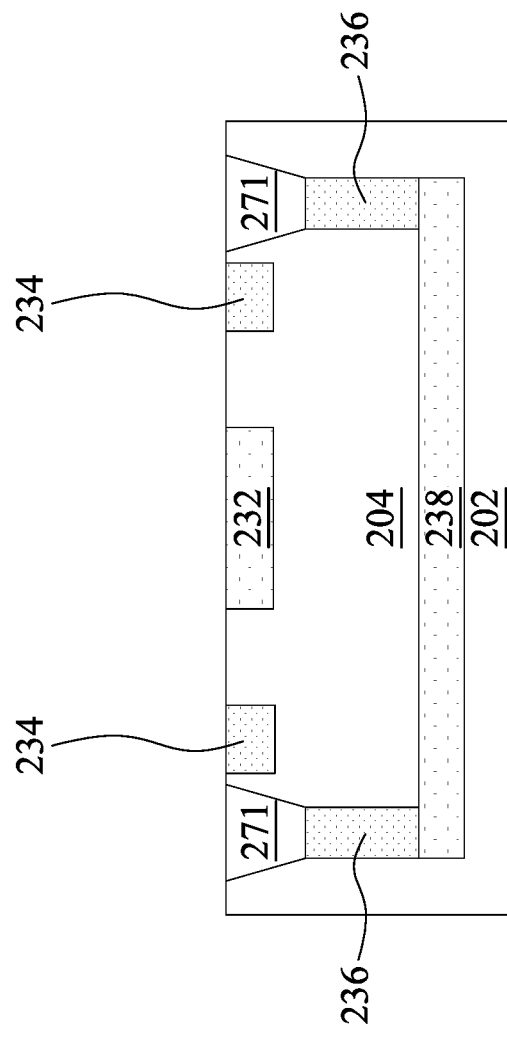
Figure 6D:
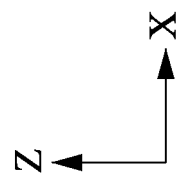
Figure 6E:
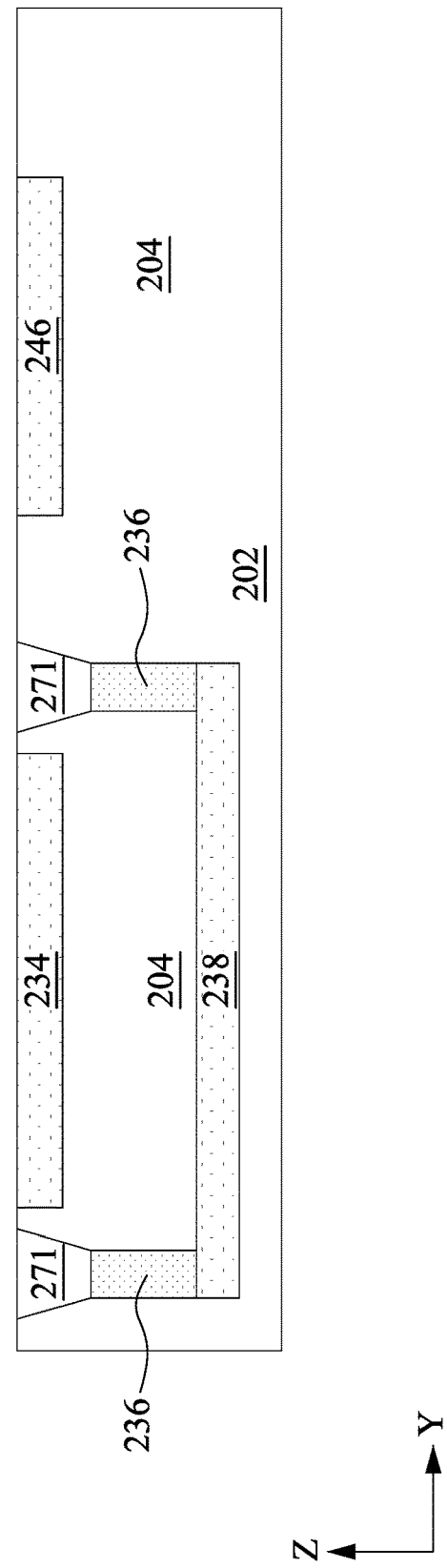
Figure 7A:
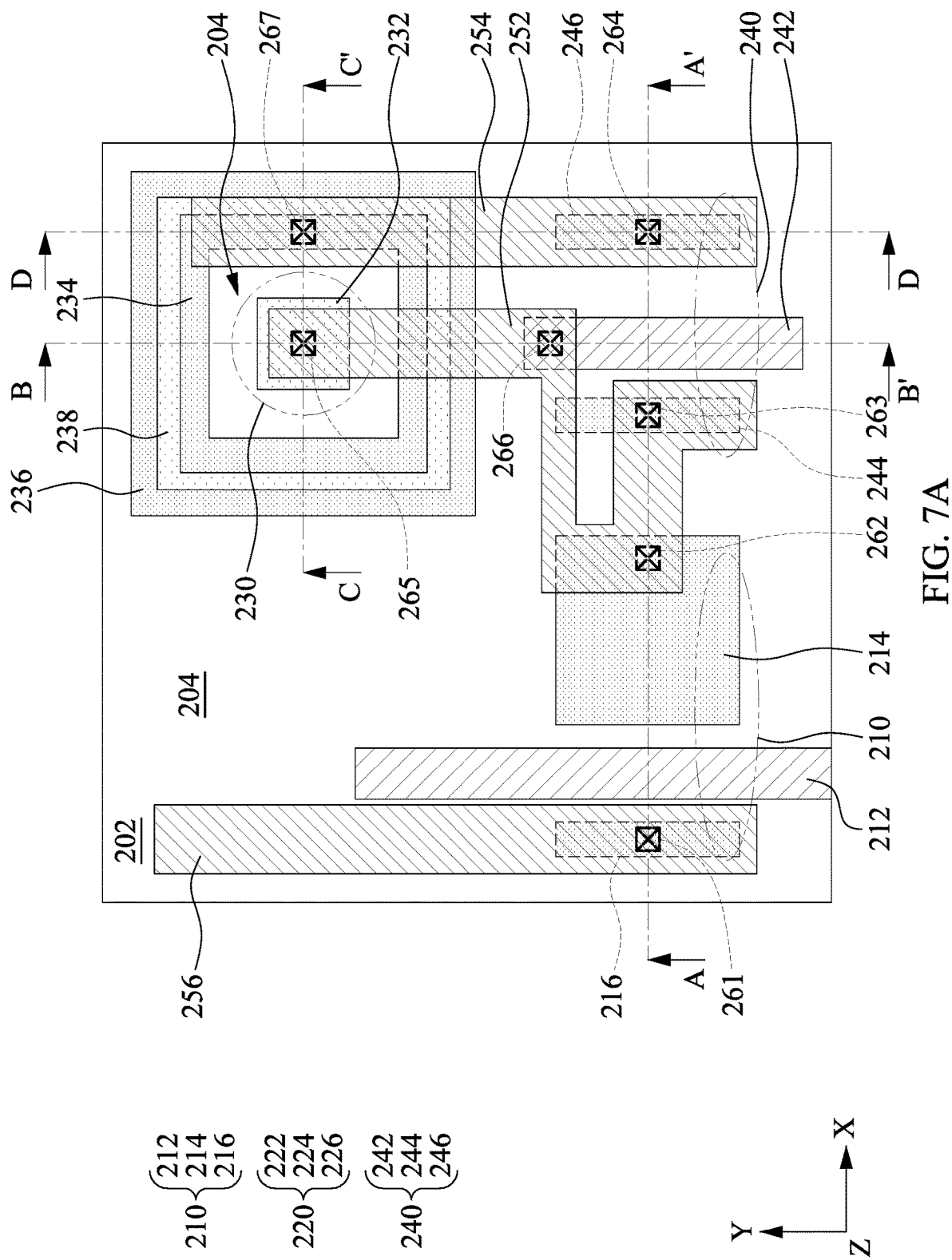
Figure 7B:
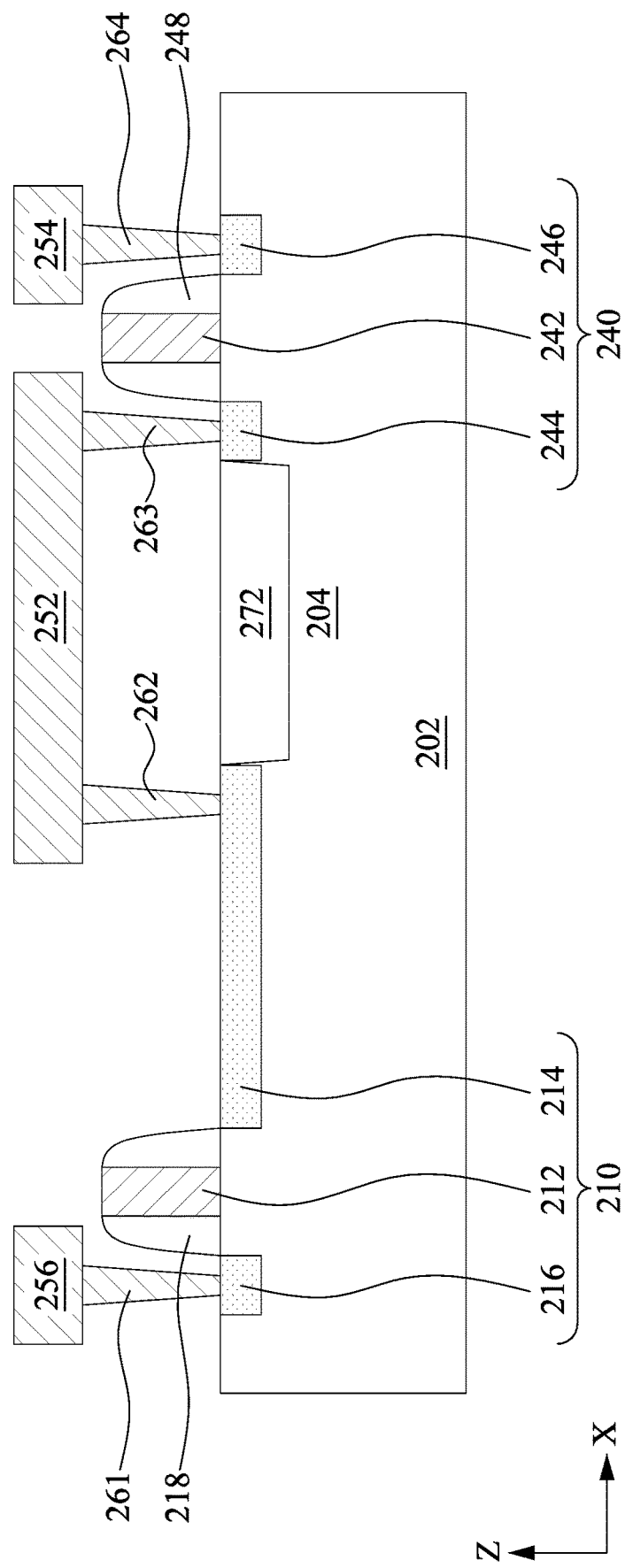
Figure 7C:
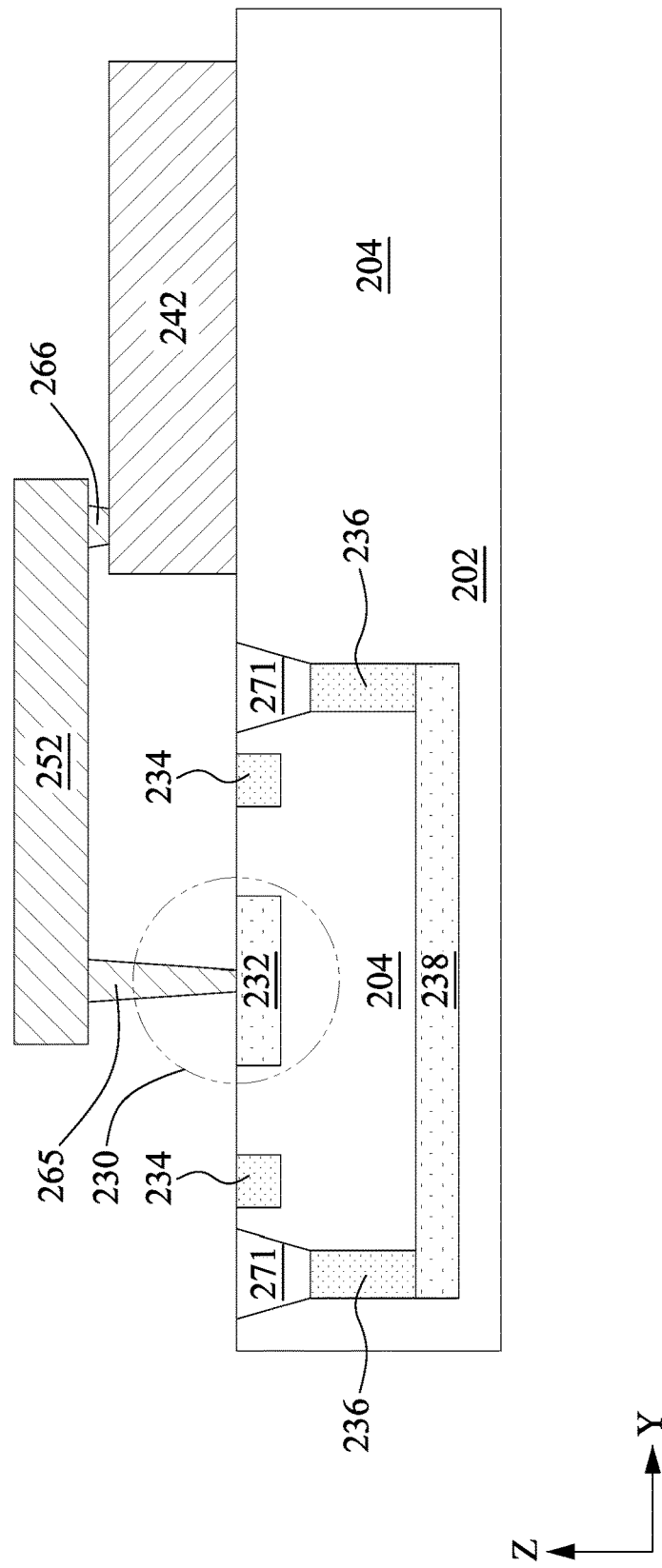
Figure 7D:
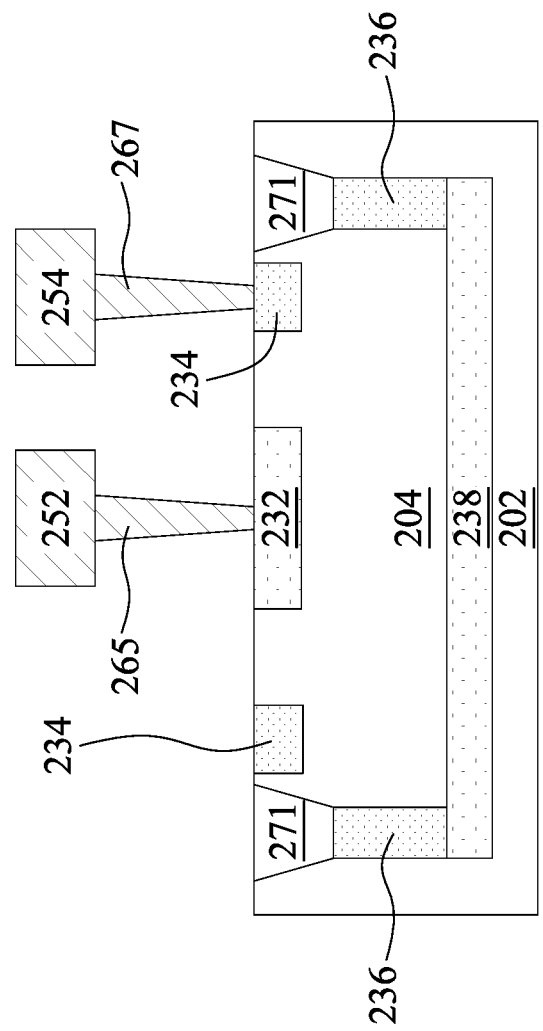
Figure 7E:
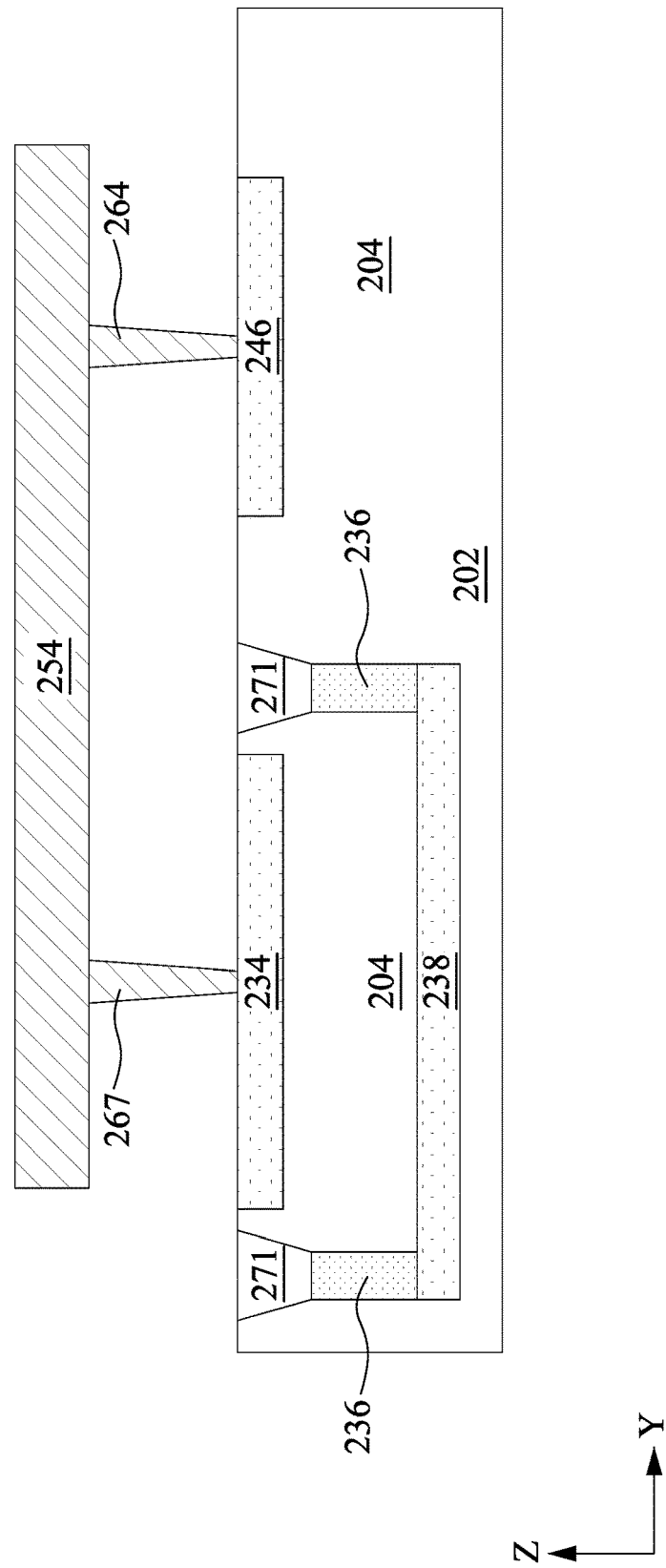
Figure 8A:
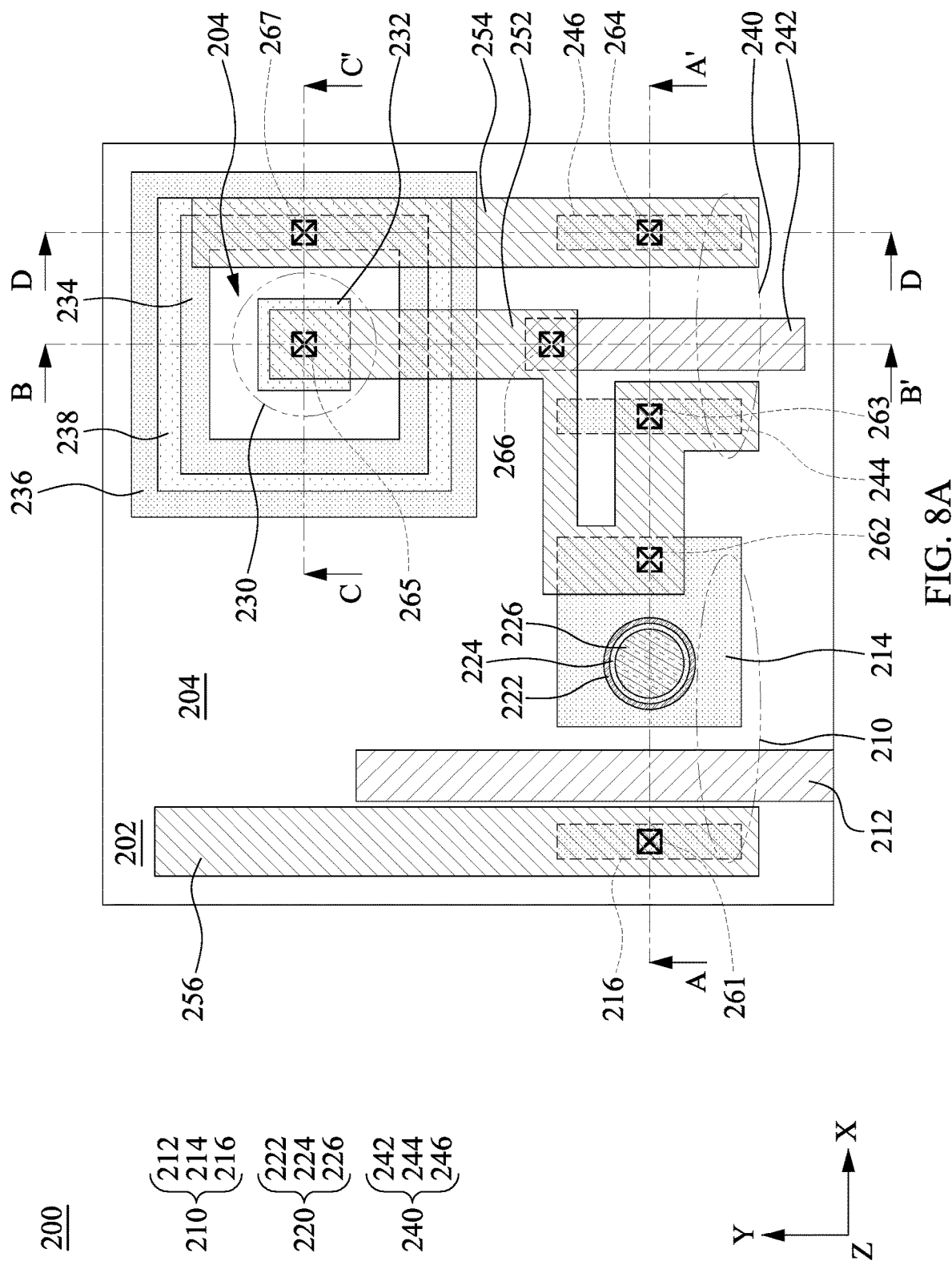
Figure 8B:
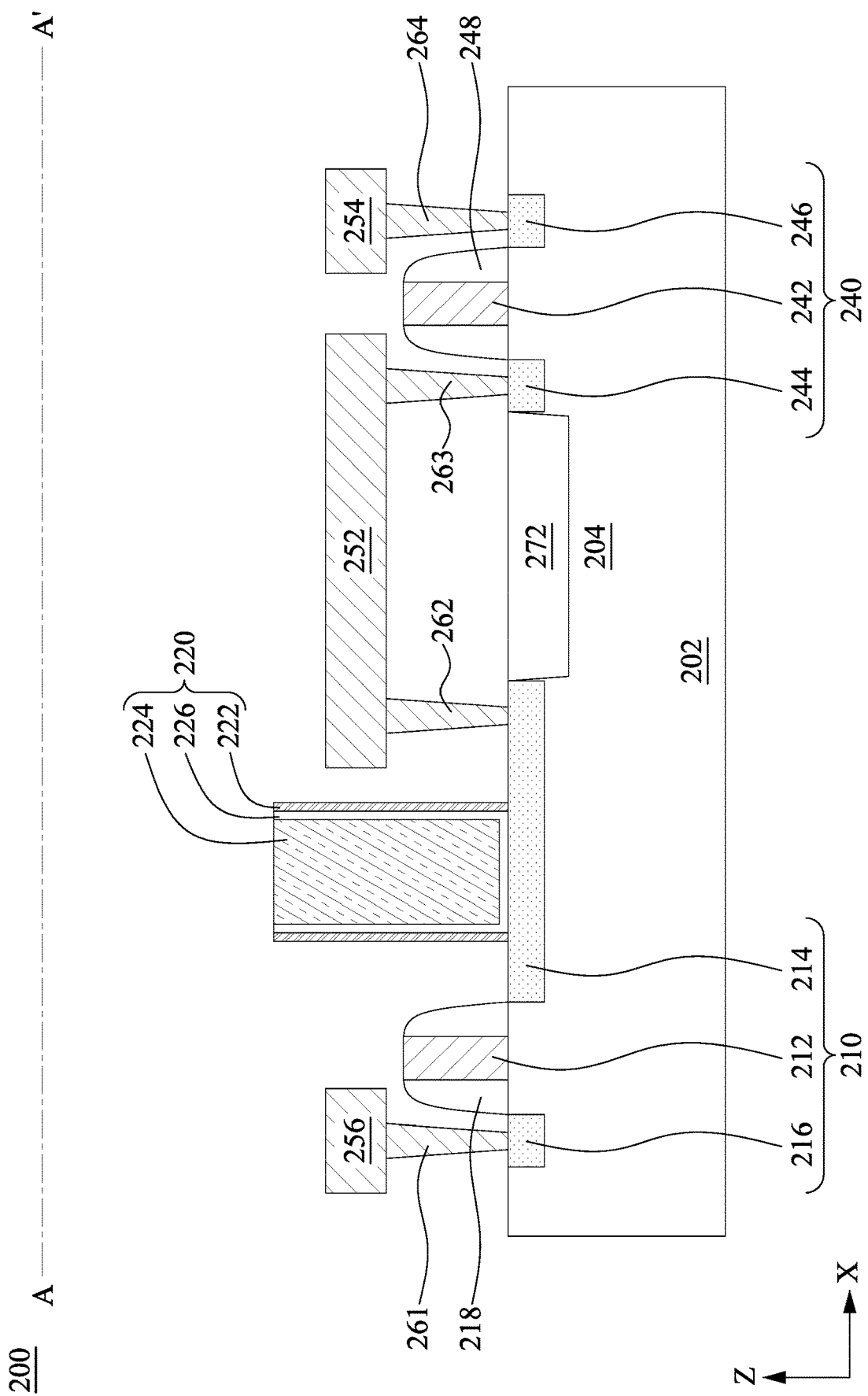
Figure 8C:
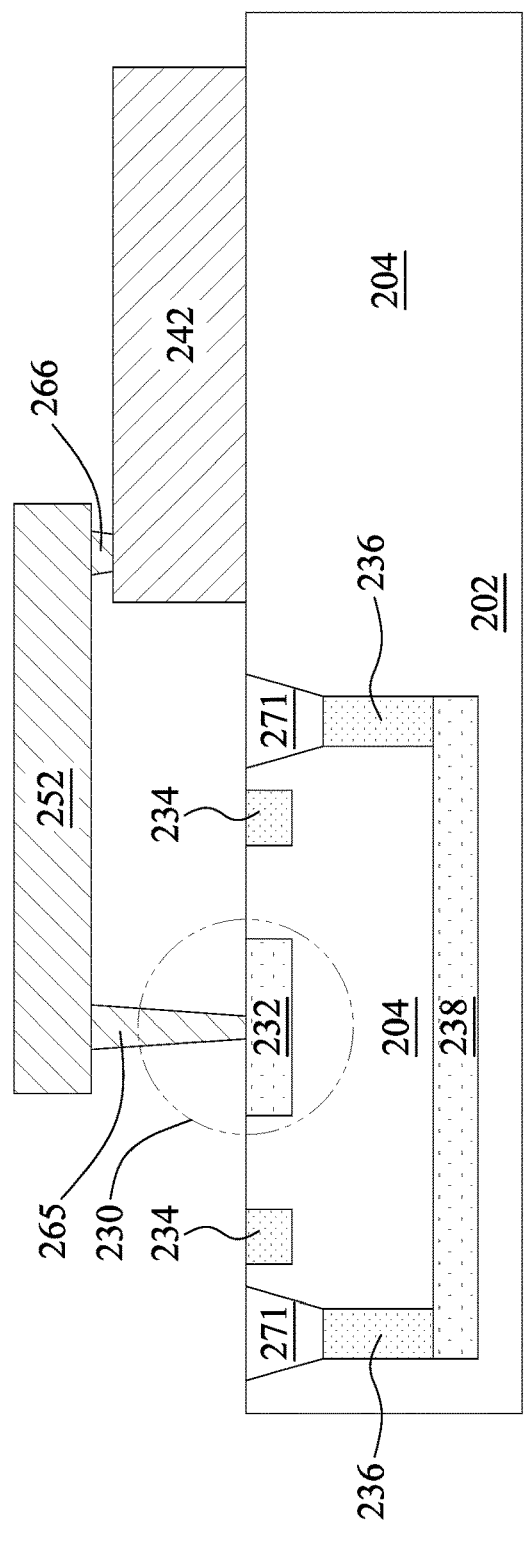
Figure 8D:
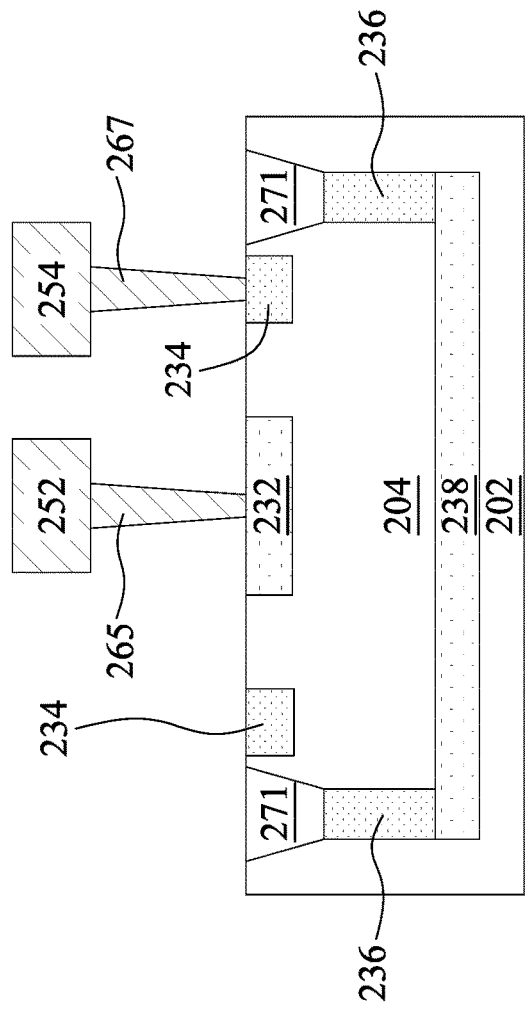
Figure 8E:
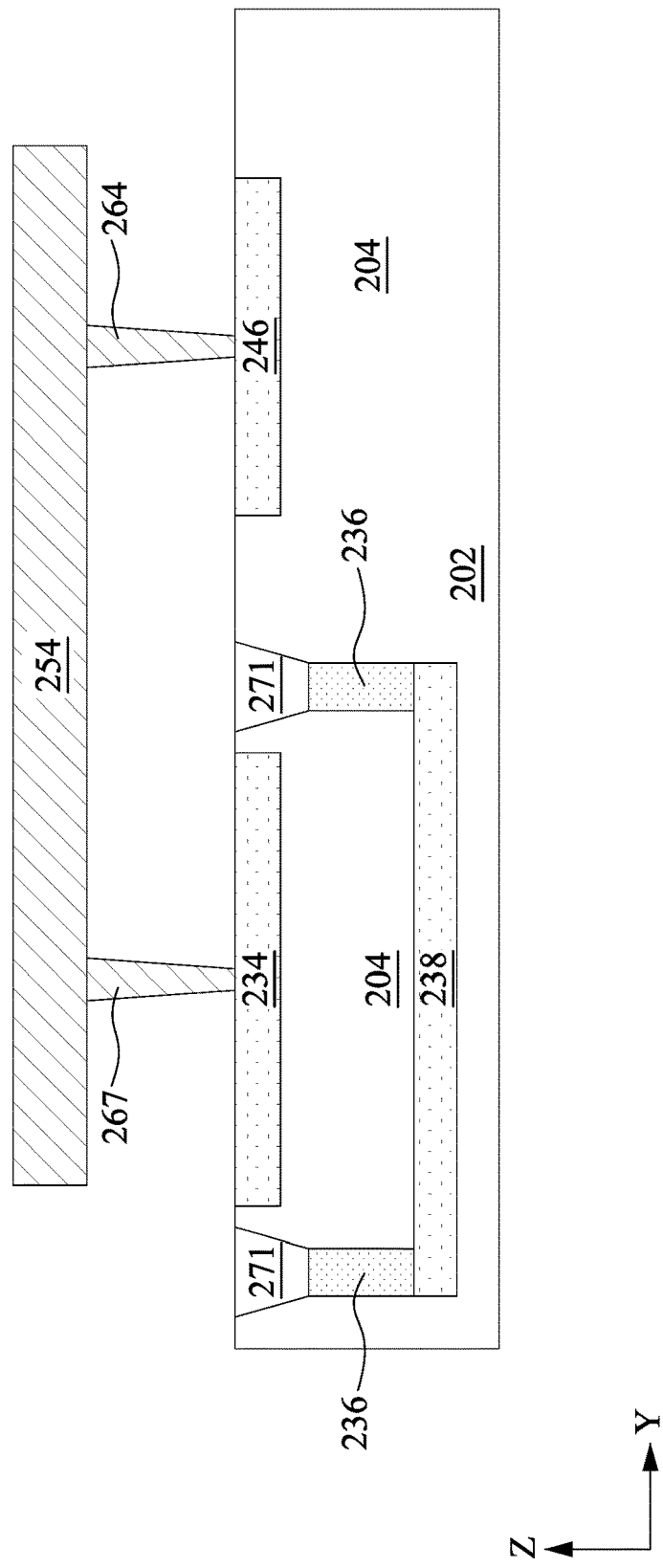

FIG. 3 is a flow chart illustrating a method 300 for manufacturing a semiconductor device, in accordance with various aspects of the present disclosure.

The method 300 begins with operation 302 in which a substrate is provided. A first well region can be formed within the substrate. The first well region has a first conductive type.

The method 300 continues with operation 304 in which a first transistor is formed. The first transistor can include a gate structure, and a first doped region. The gate structure can be electrically coupled to or connected to a word line of the semiconductor device. The first doped region can include a second conductive type different from the first conductive type.

The method 300 continues with operation 306 in which a capacitor structure is formed. The capacitor structure can be formed on the substrate. The capacitor structure can include a first electrode and a second electrode. The first electrode of the capacitor structure can be electrically connected to the second terminal of the first transistor. The second electrode of the capacitor structure can be electrically coupled to or connected to a first voltage, which can be ground. The first transistor and the capacitor structure can collectively serve as a memory device.

The method 300 continues with operation 308 in which a second doped region can be formed. The second doped region can include the second conductive type. The second doped region and a portion of the first well region can collectively serve as a diode. The second doped region can be electrically coupled to or connected to a node between the first transistor and the capacitor structure.

The method 300 continues with operation 310 in which a third doped region is formed. The third doped region can include the first conductive type. The third doped region can surround the second doped region. The third doped region can be spaced apart from the second doped region by the first well region.

The method 300 continues with operation 312 in which a fourth doped region is formed. The fourth doped region can include the second conductive type. The fourth doped region can surround the second doped region. The fourth doped region can be formed under an isolation feature, such as STI.

The method 300 continues with operation 314 in which a second well region is formed. The second well region can include the second conductive type. The second well region can be disposed beneath the fourth doped region. The second well region can be spaced apart from the second doped region by the first well region. The second well region can be spaced apart from the third doped region by the first well region.

The method 300 continues with operation 316 in which a second transistor is formed. The second transistor can serve as an equalizer. Forming the second transistor can include forming a second gate structure, a fifth doped region, and a sixth doped region. The fifth doped region can include the second conductive type. The fifth doped region can be electrically coupled to or connected to the second doped region. The sixth doped region can include the second conductive type. The sixth doped region can be electrically connected to the third doped region.

The method 300 continues with operation 318 in which a first conductive layer and a second conductive layer are formed. The first conductive layer can be formed on the substrate. The first conductive layer can be configured to electrically couple the first doped region, the second gate structure, the fifth doped region, and the second doped region to each other. The second conductive layer can be configured to electrically couple the sixth doped region to the third doped region.

The method 300 is merely an example, and is not intended to limit the present disclosure beyond what is explicitly recited in the claims. Additional operations can be provided before, during, or after each operation of the method 300, and some operations described can be replaced, eliminated, or moved around for additional embodiments of the method. In some embodiments, the method 300 can include further operations not depicted in FIG. 3. In some embodiments, the method 300 can include one or more operations depicted in FIG. 3.

FIG. 4A, FIG. 5A, FIG. 6A, FIG. 7A, and FIG. 8A illustrate various stages of manufacturing a semiconductor device, in accordance with some embodiments of the present disclosure. FIGS. 4B-8B, FIGS. 4C-8C, FIGS. 4D-8D, and FIG. 4E-8E are cross-sectional views along lines A-A', B-B', C-C', and D-D', respectively.

As shown in FIG. 4A, FIG. 4B, FIG. 4C, FIG. 4D, and FIG. 4E, a substrate 202 is provided. The substrate 202 can include a well region 204. The well region 204 can include a first conductive type. Isolation features 271 and 272 can be formed in the substrate 202. In some embodiments, an etching process can be performed to form trenches recessed from the top surface of the substrate 202, and then dielectric material, such as silicon oxide, can be deposited to fill the trenches, thereby forming the isolation features 271 and 272.

As shown in FIG. 5A, FIG. 5B, FIG. 5C, FIG. 5D, and FIG. 5E, gate structures 212 and 242 can be formed on the substrate 202. Each of the gate structure 212 and the gate structure 242 can include a gate dielectric and a gate electrode. The gate dielectric and the gate electrode can be formed by chemical vapor deposition (CVD), plasma enhanced CVE (PECVD), flowable CVD (FCVD), or other suitable processes. A spacer 218 can be formed on the sidewall of the gate structure 212. A spacer 248 can be formed on the sidewall of the gate structure 242. The spacers 218 and 248 can include multilayers, each of which can be formed by CVD, PECVD, FCVD, or other suitable processes.

As shown in FIG. 6A, FIG. 6B, FIG. 6C, FIG. 6D, and FIG. 6E, doped regions 214, 216, 232, 244, and 246 can be formed, thereby forming a transistor 210, a diode 230, and a transistor 240. The doped regions 214, 216, 232, 244, and 246 can have a second conductive type different from the first conductive type. Further, a doped region 236 can be formed beneath the isolation feature 271. A well region 238 can be formed beneath the doped region 236. A doped region 234 can be formed in the substrate 202. The doped region 234 can have the first conductive type.

As shown in FIG. 7A, FIG. 7B, FIG. 7C, FIG. 7D, and FIG. 7E, conductive vias 261, 262, 263, 264, 265, 266, and 267 can be formed. Further, conductive layers 252, 254, and 256 can be formed. The conductive layers 252, 254, and 256 can be formed by sputtering, chemical vapor deposition (CVD), physical vapor deposition (PVD), electrochemical plating (ECP), electrodeposition (ELD), atomic layer deposition (ALD), or the like, or combinations thereof.

As shown in FIG. 8A, FIG. 8B, FIG. 8C, FIG. 8D, and FIG. 8E, an electrode 222, an electrode 224, and an insulation layer 226 can be formed to define a capacitor structure 220 on the substrate 200, thereby forming the semiconductor device 200.

One aspect of the present disclosure provides a semiconductor device. The semiconductor device includes a substrate, a first gate structure, a first doped region, and a capacitor structure. The substrate includes a first well region having a first conductive type. The first gate structure is disposed on the substrate. The first doped region is in the substrate and has a second conductive type different from the first conductive type. The first gate structure and the first doped region are included in a first transistor. The capacitor structure includes a first electrode electrically coupled to the first doped region. The second doped region is in the substrate and has the second conductive type. The second doped region is electrically coupled to the first electrode of the capacitor structure and the first doped region.

Another aspect of the present disclosure provides a circuit. The circuit includes a first transistor, a capacitor, and a diode. The first transistor includes a gate configured to receive a control signal to turn on or turn off the first transistor and a source. The capacitor includes a first terminal electrically connected to the source of the first transistor and a second terminal connected to a first voltage. The diode includes a first terminal electrically connected to the source of the first transistor and a second terminal connected to a second voltage.

Another aspect of the present disclosure provides a method for manufacturing a semiconductor device. The method includes providing a substrate. The substrate comprises a first well region having a first conductive type. The method also includes forming a first gate structure on the substrate. The method further includes forming a first doped region in the substrate. The first doped region has a second conductive type different from the first conductive type. The first gate structure and the first doped region are included in a first transistor. In addition, the method includes forming a capacitor structure electrically coupled to the first doped region of the substrate. The method also includes forming a second doped region in the substrate. The second doped region has the second conductive type, the second doped region and the first well region collectively serve a diode, and the second doped region is electrically coupled to the first electrode of the capacitor structure and the first doped region.

The embodiments of the present disclosure disclose a semiconductor device including a memory cell, a diode, and a transistor. Each of the diode and the transistor can be electrically connected to a capacitor of the memory cell. When the voltage at the node between the capacitor and the diode is lower than a threshold voltage, the diode will turn. The transistor will turn on after the diode has been turned on, pulling up the voltage at the node between the capacitor and the diode. As a result, the data stored in the memory cell can be refreshed automatically.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate comprising a first well region having a first conductive type;
   a first gate structure disposed on the substrate;
   a first doped region in the substrate and having a second conductive type different from the first conductive type, wherein the first gate structure and the first doped region are included in a first transistor;
   a capacitor structure comprising a first electrode electrically coupled to the first doped region;
   a second doped region in the substrate and having the second conductive type, wherein the second doped region is electrically coupled to the first electrode of the capacitor structure and the first doped region, wherein the second doped region and a portion of the first well region collectively serve as a diode; and
   a third doped region in the substrate and having the first conductive type, wherein the third doped region surrounds the second doped region.

2. The semiconductor device of claim 1, further comprising:
   a fourth doped region in the substrate and having the second conductive type, wherein the fourth doped region surrounds the third doped region.

3. The semiconductor device of claim 2, further comprising:
   a second well region in the substrate and having the second conductive type, wherein the second well region is spaced apart from the third doped region by the first well region.

4. The semiconductor device of claim 3, wherein the second well region is in contact with the fourth doped region.

5. The semiconductor device of claim 1, further comprising:
   a second gate structure disposed on the substrate;
   a fifth doped region disposed in the substrate and having the second conductive type; and
   a sixth doped region disposed in the substrate and having the second conductive type, wherein the second gate structure, the fifth doped region, and the sixth doped region are included in a second transistor, and
   wherein the second gate structure is electrically coupled to the second doped region of the diode and coupled to the first doped region of the first transistor.

6. The semiconductor device of claim 5, wherein the fifth doped region is electrically coupled to the first doped region of the first transistor.

7. The semiconductor device of claim 6, further comprising:
   a first conductive layer disposed on the substrate, wherein the first conductive layer is configured to electrically connect the first doped region, the second gate structure, the fifth doped region, and the second doped region to each other.

8. The semiconductor device of claim 5, wherein the sixth doped region is electrically coupled to the third doped region.

9. The semiconductor device of claim 5, wherein the second gate structure, the fifth doped region, the sixth doped region, and the capacitor structure are aligned to each other along a first direction.

10. The semiconductor device of claim 9, wherein the second doped region is aligned to the second gate structure along a second direction substantially perpendicular to the first direction.

11. The semiconductor device of claim 5, wherein the capacitor structure is disposed between the first gate structure and the second gate structure.

12. The semiconductor device of claim 1, wherein the first electrode of the capacitor structure is in contact with the first doped region of the substrate.

13. A circuit, comprising:
   a first transistor comprising a first gate configured to receive a control signal to turn on or turn off the first transistor and a first source;
   a capacitor comprising a first terminal electrically connected to the first source of the first transistor and a second terminal connected to a first voltage; and
   a diode comprising a first terminal electrically connected to the first source of the first transistor and a second terminal connected to a second voltage, wherein the second voltage is a direct current (DC) voltage having a voltage level higher than the first voltage.

14. The circuit of claim 13, wherein the first voltage is ground.

15. The circuit of claim 13, wherein the first terminal of the diode is a cathode, and the second terminal of the diode is an anode.

* * * * *